(12) United States Patent
Park et al.

(10) Patent No.: US 12,062,661 B2
(45) Date of Patent: Aug. 13, 2024

(54) SEMICONDUCTOR DEVICE

(71) Applicant: SAMSUNG ELECTRONICS CO., LTD., Suwon-si (KR)

(72) Inventors: Jongho Park, Suwon-si (KR); Jaeyeol Song, Seoul (KR); Wandon Kim, Seongnam-si (KR); Byounghoon Lee, Suwon-si (KR); Musarrat Hasan, Sejong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/831,861

(22) Filed: Jun. 3, 2022

(65) Prior Publication Data

US 2022/0302115 A1 Sep. 22, 2022

Related U.S. Application Data

(63) Continuation of application No. 16/840,880, filed on Apr. 6, 2020, now Pat. No. 11,387,236.

(30) Foreign Application Priority Data

Sep. 17, 2019 (KR) .................. 10-2019-0114081

(51) Int. Cl.
*H01L 27/092* (2006.01)
*H01L 21/8238* (2006.01)
(Continued)

(52) U.S. Cl.
CPC .. *H01L 27/0922* (2013.01); *H01L 21/823807* (2013.01); *H01L 21/823814* (2013.01);
(Continued)

(58) Field of Classification Search
CPC ............... H01L 29/66545; H01L 29/49; H01L 27/0922; H01L 21/845; H01L 29/41791
See application file for complete search history.

(56) References Cited

U.S. PATENT DOCUMENTS 7,514,753 B2  4/2009  Tsuchiya et al.
8,129,794 B2  3/2012  Hirase
(Continued)

FOREIGN PATENT DOCUMENTS

JP  4929867 B2  2/2012
JP  2013004968 A  1/2013
(Continued)

*Primary Examiner* — Brian Turner
(74) *Attorney, Agent, or Firm* — Myers Bigel, P.A.

(57) ABSTRACT

A semiconductor device includes first and second active patterns on first and second active regions of a substrate, respectively, a pair of first source/drain patterns and a first channel pattern therebetween which are in an upper portion of the first active pattern, a pair of second source/drain patterns and a second channel pattern therebetween which are in an upper portion of the second active pattern, and first and second gate electrodes intersecting the first and second channel patterns, respectively. Each of the first and second gate electrodes includes a first metal pattern adjacent to a corresponding one of the first and second channel patterns. The first and second channel patterns include SiGe. A Ge concentration of the second channel pattern is higher than a Ge concentration of the first channel pattern. A thickness of the first metal pattern of the second gate electrode is greater than a thickness of the first metal pattern of the first gate electrode.

10 Claims, 36 Drawing Sheets

(51) Int. Cl.
    *H01L 29/06*     (2006.01)
    *H01L 29/08*     (2006.01)
    *H01L 29/10*     (2006.01)
    *H01L 29/161*     (2006.01)
    *H01L 29/417*     (2006.01)
    *H01L 29/423*     (2006.01)
    *H01L 29/49*     (2006.01)
    *H01L 29/51*     (2006.01)
    *H01L 29/66*     (2006.01)
    *H01L 29/78*     (2006.01)
    *H01L 29/786*     (2006.01)

(52) U.S. Cl.
    CPC ........ *H01L 21/823821* (2013.01); *H01L 21/823842* (2013.01); *H01L 21/823857* (2013.01); *H01L 21/823871* (2013.01); *H01L 27/0924* (2013.01); *H01L 29/0653* (2013.01); *H01L 29/0673* (2013.01); *H01L 29/0847* (2013.01); *H01L 29/1054* (2013.01); *H01L 29/161* (2013.01); *H01L 29/41791* (2013.01); *H01L 29/42392* (2013.01); *H01L 29/4908* (2013.01); *H01L 29/4966* (2013.01); *H01L 29/516* (2013.01); *H01L 29/517* (2013.01); *H01L 29/66545* (2013.01); *H01L 29/7848* (2013.01); *H01L 29/78696* (2013.01)

(56) References Cited

U.S. PATENT DOCUMENTS

| | | |
|---|---|---|
| 8,294,180 B2 | 10/2012 | Doyle et al. |
| 9,362,277 B2 | 6/2016 | Chi et al. |
| 9,728,467 B2 | 8/2017 | Chang et al. |
| 10,141,430 B1 | 11/2018 | Fung |
| 10,262,905 B2 | 4/2019 | Cheng et al. |
| 2008/0116487 A1 | 5/2008 | Lee et al. |
| 2009/0050982 A1 | 2/2009 | Pantisano et al. |
| 2012/0244670 A1* | 9/2012 | Do .............. H01L 21/2822 257/E21.409 |
| 2012/0319207 A1 | 12/2012 | Iijima |
| 2014/0299934 A1 | 10/2014 | Kim et al. |
| 2015/0187763 A1* | 7/2015 | Kim .............. H01L 29/518 257/368 |
| 2016/0049400 A1 | 2/2016 | Togo et al. |
| 2016/0126343 A1 | 5/2016 | Ching et al. |
| 2016/0218007 A1 | 7/2016 | Wen et al. |
| 2016/0351569 A1 | 12/2016 | Song et al. |
| 2016/0365439 A1 | 12/2016 | Lin et al. |
| 2017/0033106 A1 | 2/2017 | Walke et al. |
| 2018/0308763 A1 | 10/2018 | Bi et al. |
| 2019/0139828 A1 | 5/2019 | Cheng et al. |
| 2020/0020690 A1* | 1/2020 | Ando ............ H01L 29/42392 |
| 2020/0044087 A1* | 2/2020 | Guha ............ H01L 29/66439 |
| 2020/0135737 A1 | 4/2020 | Liaw |
| 2020/0135913 A1* | 4/2020 | More ............ H01L 29/0847 |
| 2020/0312658 A1 | 10/2020 | Miura et al. |
| 2020/0373400 A1 | 11/2020 | Cheng et al. |
| 2020/0411662 A1 | 12/2020 | Lin et al. |
| 2020/0411691 A1 | 12/2020 | Jambunathan et al. |
| 2021/0028290 A1* | 1/2021 | Hsiao ............ H01L 21/823821 |

FOREIGN PATENT DOCUMENTS

| | | |
|---|---|---|
| KR | 20160139814 A | 12/2016 |
| KR | 101735204 B1 | 5/2017 |

* cited by examiner

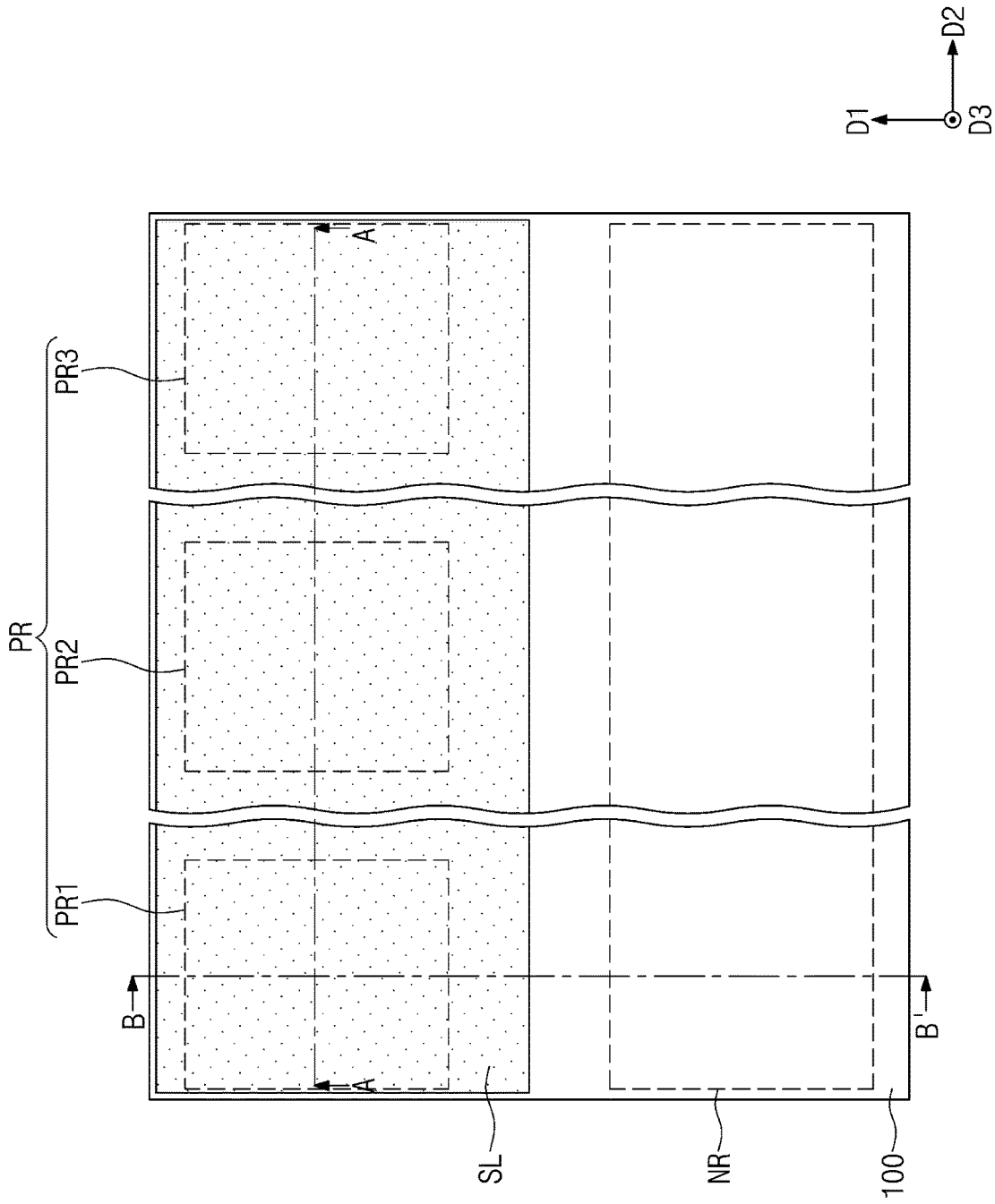

FIG. 5B
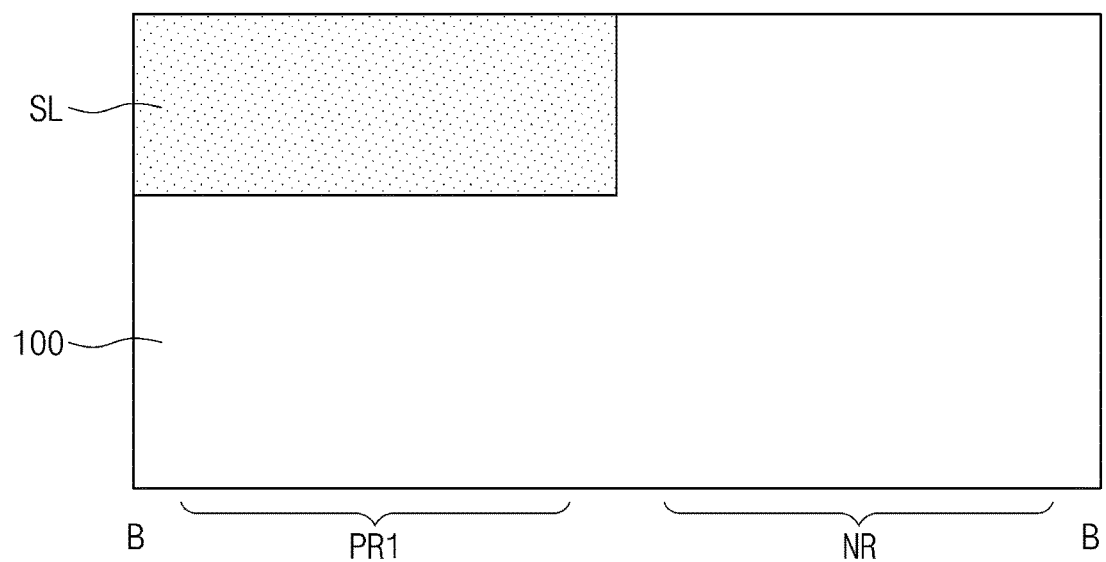
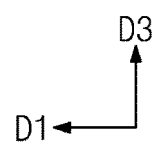

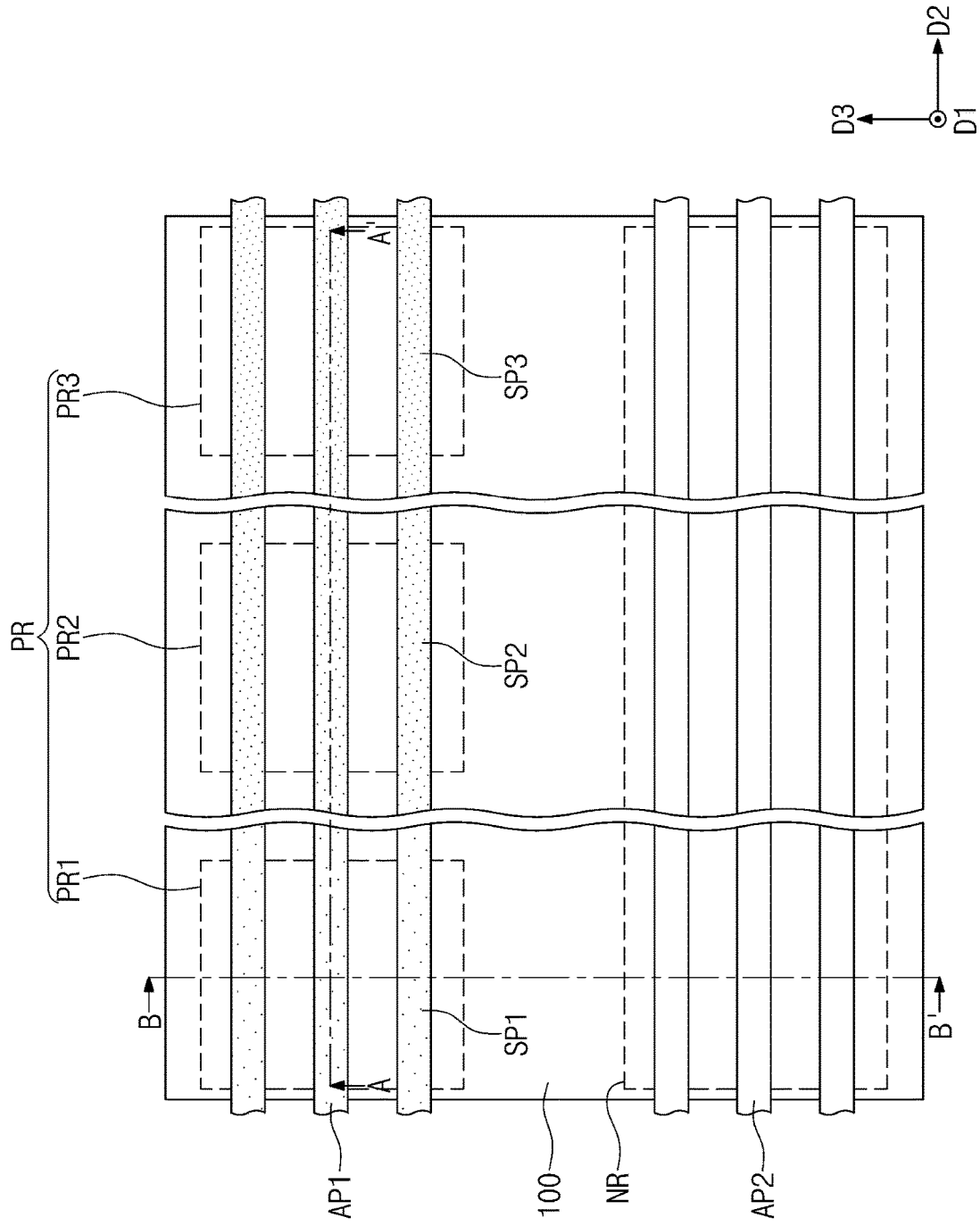

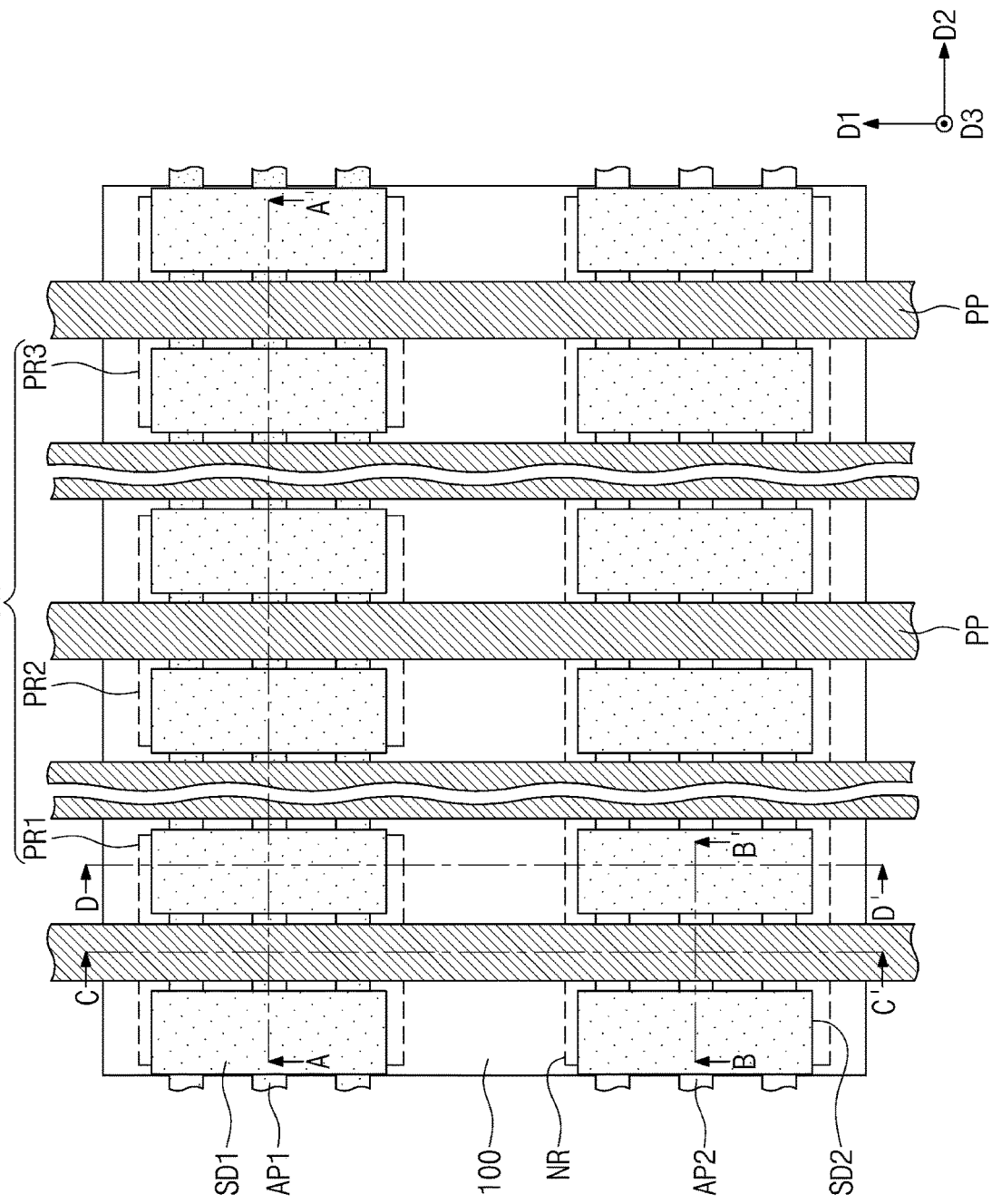

SEMICONDUCTOR DEVICE

CROSS-REFERENCE TO RELATED APPLICATIONS

This U.S. non-provisional patent application is a continuation of U.S. patent application Ser. No. 16/840,880, filed Apr. 6, 2020, which itself claims priority under 35 U.S.C. § 119 to Korean Patent Application No. 10-2019-0114081, filed on Sep. 17, 2019, in the Korean Intellectual Property Office, the disclosures of both of which are hereby incorporated by reference in its entirety.

BACKGROUND

Embodiments of the inventive concepts relate to a semiconductor device and, more particularly, to a semiconductor device including a field effect transistor and a method for manufacturing the same.

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming semiconductor devices which have excellent performance while overcoming limitations by the high integration have been studied.

SUMMARY

Embodiments of the inventive concepts may provide a semiconductor device with improved electrical characteristics.

In some embodiments, a semiconductor device may include a substrate including a first active region and a second active region, a first active pattern and a second active pattern on the first and second active regions, respectively, a pair of first source/drain patterns and a first channel pattern between the pair of first source/drain patterns, which are in an upper portion of the first active pattern, a pair of second source/drain patterns and a second channel pattern between the pair of second source/drain patterns, which are in an upper portion of the second active pattern, and first and second gate electrodes intersecting the first and second channel patterns, respectively. Each of the first and second gate electrodes may include a first metal pattern adjacent to a corresponding one of the first and second channel patterns. The first and second channel patterns may include silicon-germanium (SiGe). A concentration of germanium (Ge) of the second channel pattern may be higher than a concentration of germanium (Ge) of the first channel pattern, and a thickness of the first metal pattern of the second gate electrode may be greater than a thickness of the first metal pattern of the first gate electrode.

In some embodiments, a semiconductor device may include a substrate including a first active region and a second active region, a first active pattern and a second active pattern on the first and second active regions, respectively, a pair of first source/drain patterns and a first channel pattern between the pair of first source/drain patterns, which are in an upper portion of the first active pattern, a pair of second source/drain patterns and a second channel pattern between the pair of second source/drain patterns, which are provided in an upper portion of the second active pattern, first and second gate electrodes intersecting the first and second channel patterns, respectively, a first gate dielectric pattern between the first gate electrode and the first channel pattern, and a second gate dielectric pattern between the second gate electrode and the second channel pattern. A concentration of germanium (Ge) of the first channel pattern may be different from a concentration of germanium (Ge) of the second channel pattern, and the first gate dielectric pattern may include lanthanum (La) or aluminum (Al).

In some embodiments, a semiconductor device may include a substrate including a PMOSFET region and an NMOSFET region spaced apart from each other in a first direction, a first active pattern and a second active pattern on the PMOSFET region and the NMOSFET region, respectively, the first and second active patterns extending in a second direction intersecting the first direction, the first active pattern having an upper portion including a semiconductor pattern, a device isolation layer on the substrate that extends over a sidewall of a lower portion of each of the first and second active patterns, the first and second active patterns having upper portions protruding upward from a top surface of the device isolation layer, a pair of first source/drain patterns in the upper portion of the first active pattern, a pair of second source/drain patterns in the upper portion of the second active pattern, a gate electrode intersecting the first and second active patterns and extending in the first direction, a gate dielectric pattern between the gate electrode and the first and second active patterns, active contacts electrically connected to the first and second source/drain patterns, and interconnection lines on the active contacts and electrically connected to the active contacts and the gate electrode. The semiconductor pattern of the first active pattern may include silicon-germanium (SiGe). The semiconductor pattern of the first active pattern may further include nitrogen (N) as an impurity. A concentration of germanium (Ge) in the semiconductor pattern may increase from a top surface of the semiconductor pattern toward a bottom surface of the semiconductor pattern. A concentration of nitrogen (N) in the semiconductor pattern may decrease from the top surface of the semiconductor pattern toward the bottom surface of the semiconductor pattern.

BRIEF DESCRIPTION OF THE DRAWINGS

The inventive concepts will become more apparent in view of the attached drawings and accompanying detailed description.

FIGS. 4, 6, 8, 10, 12, 14 and 16 are plan views illustrating a method for manufacturing a semiconductor device according to some embodiments of the inventive concepts.

FIGS. 5B, 7B, 9B, 11B, 13B, 15B and 17B are cross-sectional views taken along lines B-B' of FIGS. 4, 6, 8, 10, 12, 14 and 16, respectively.

DETAILED DESCRIPTION OF THE EMBODIMENTS

Figure 1:
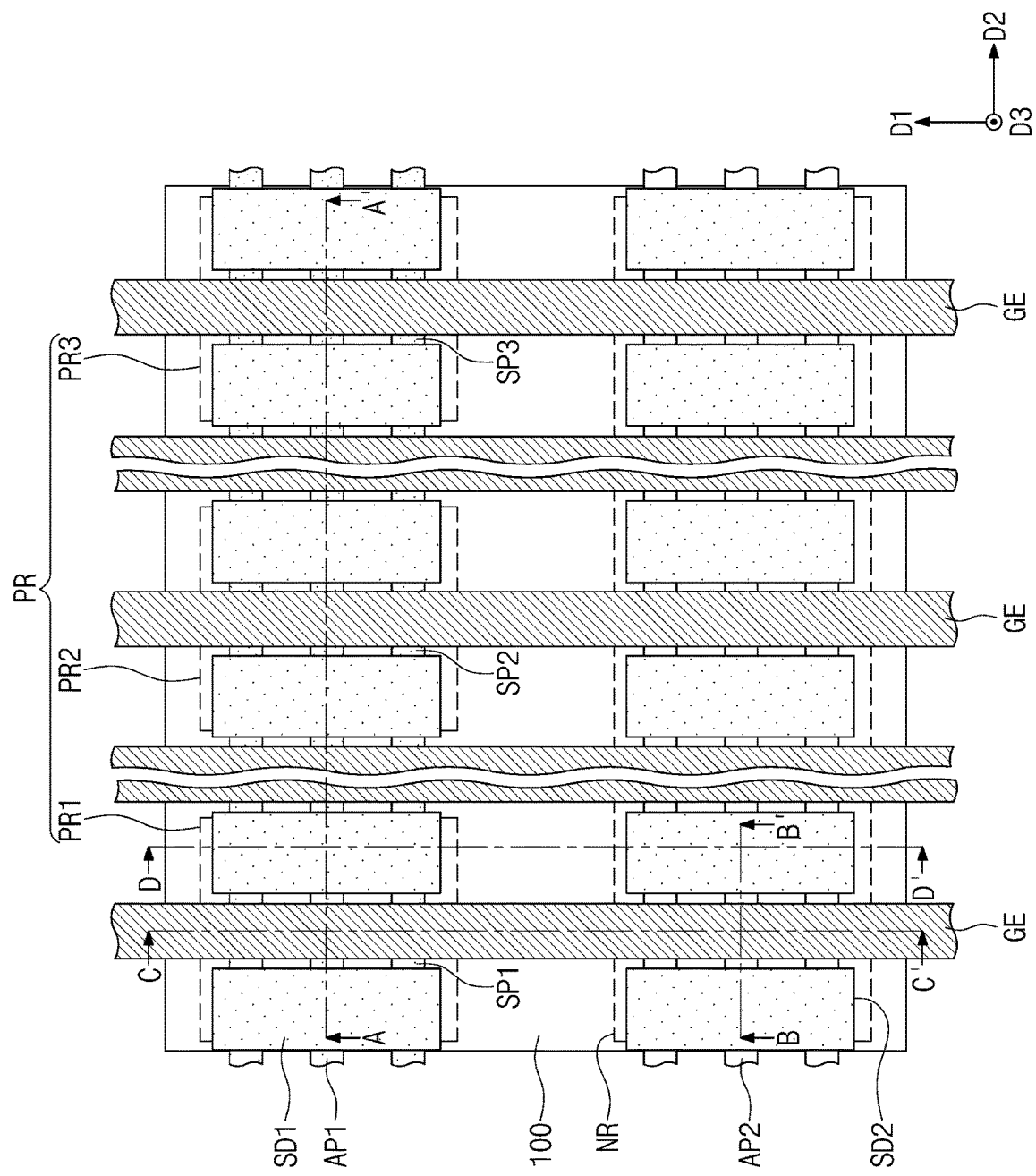
FIG. 1 is a plan view illustrating a semiconductor device according to some embodiments of the inventive concepts.
Figure 2A:
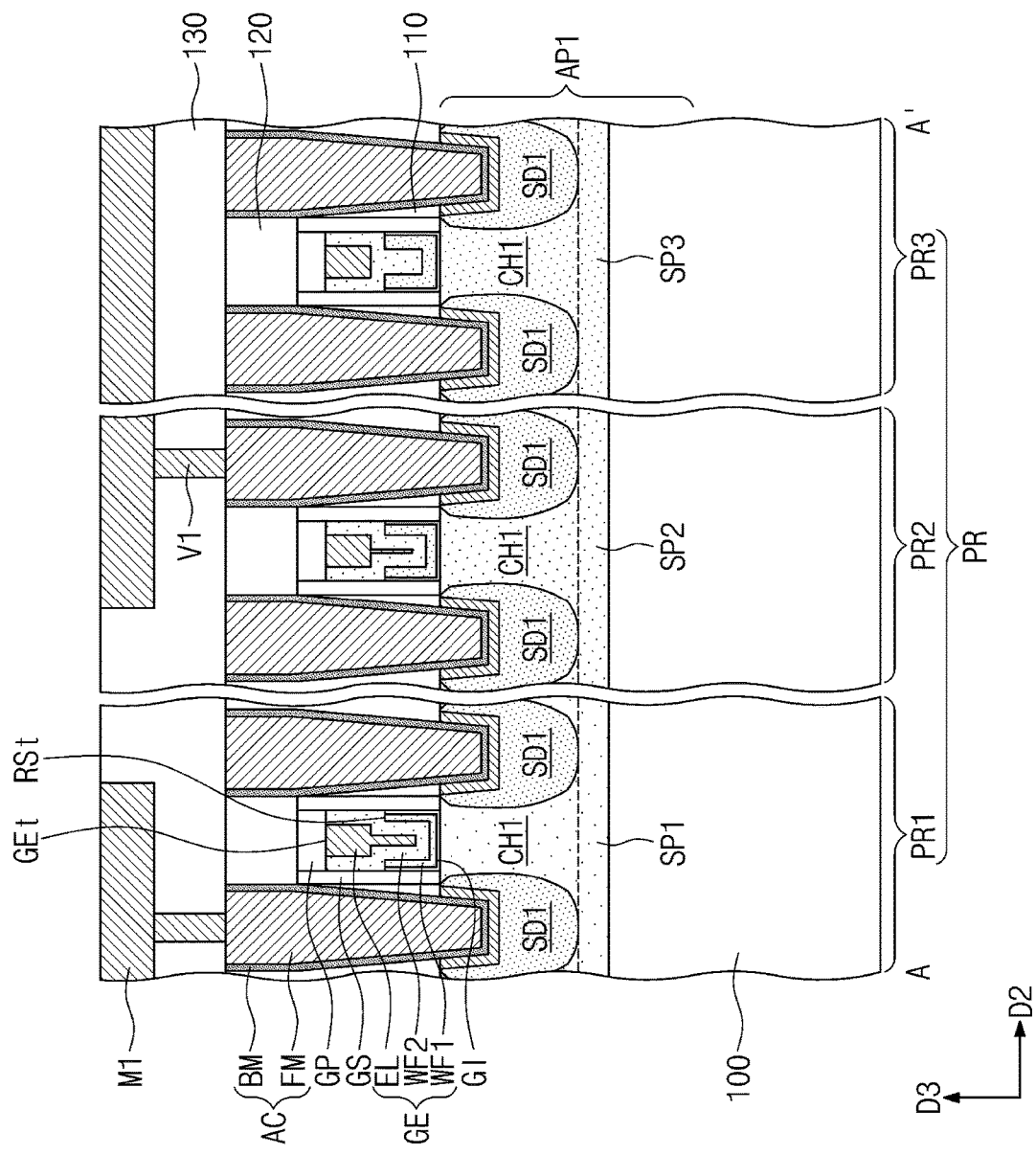
FIGS. 2A, 2B, 2C and 2D are cross-sectional views taken along lines A-A', B-B', C-C' and D-D' of FIG. 1, respectively.
Figure 2B:
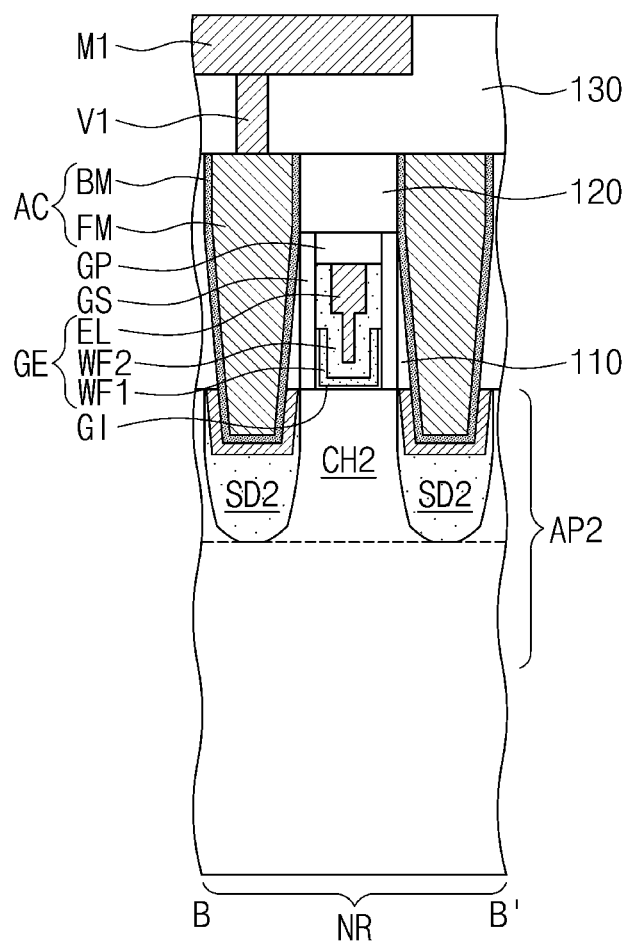
Figure 2C:
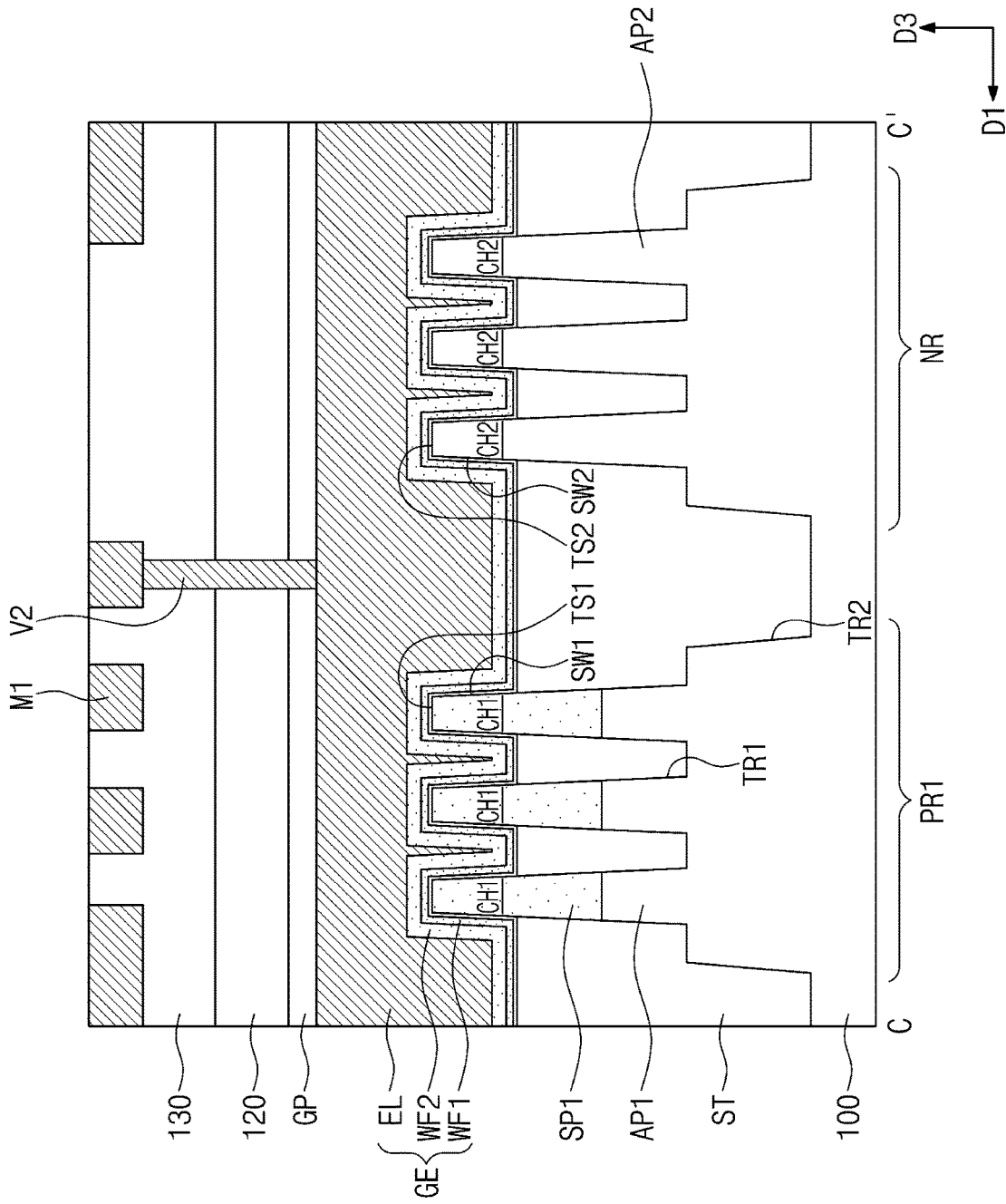
Figure 2D:
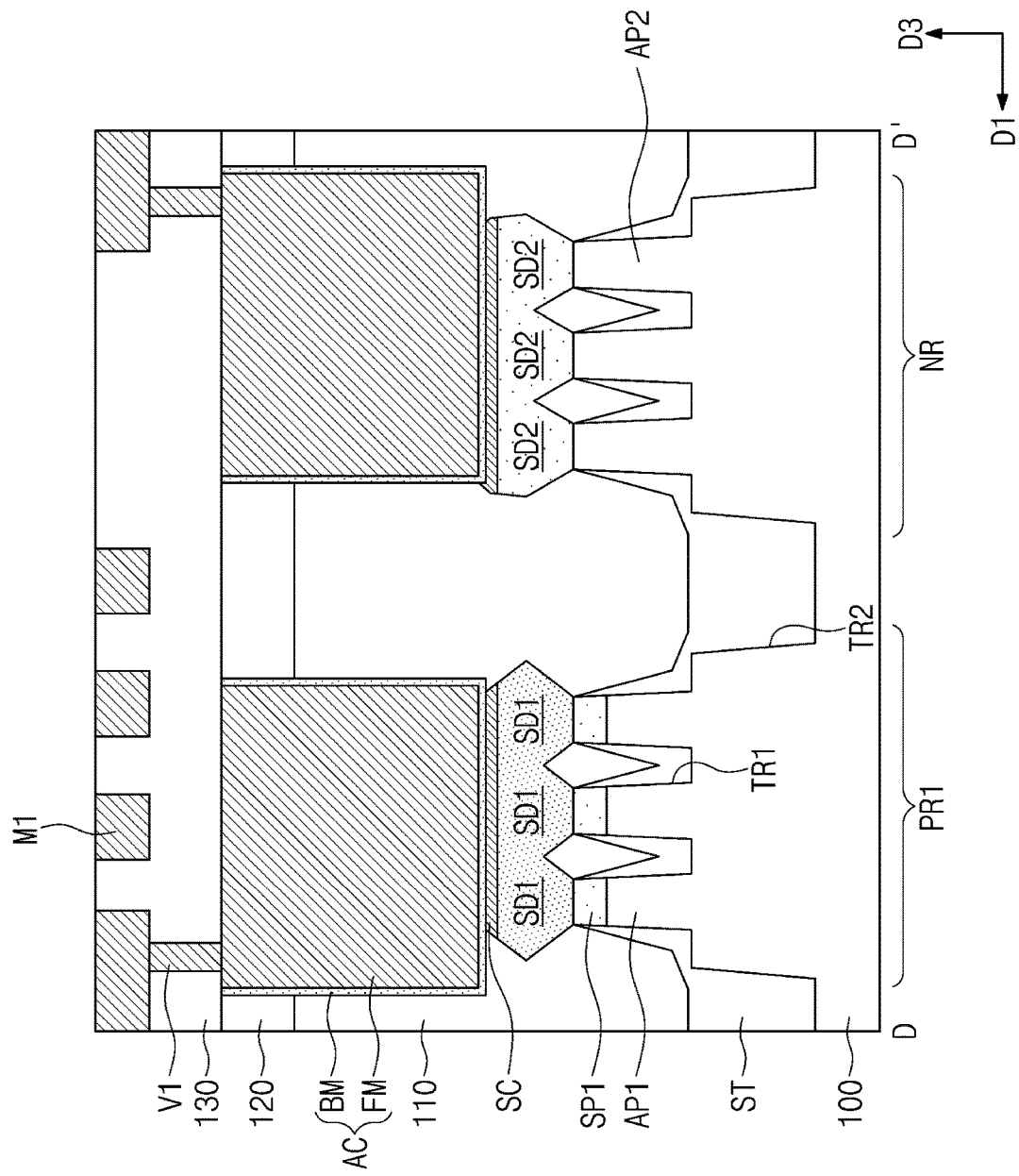
Figure 3:
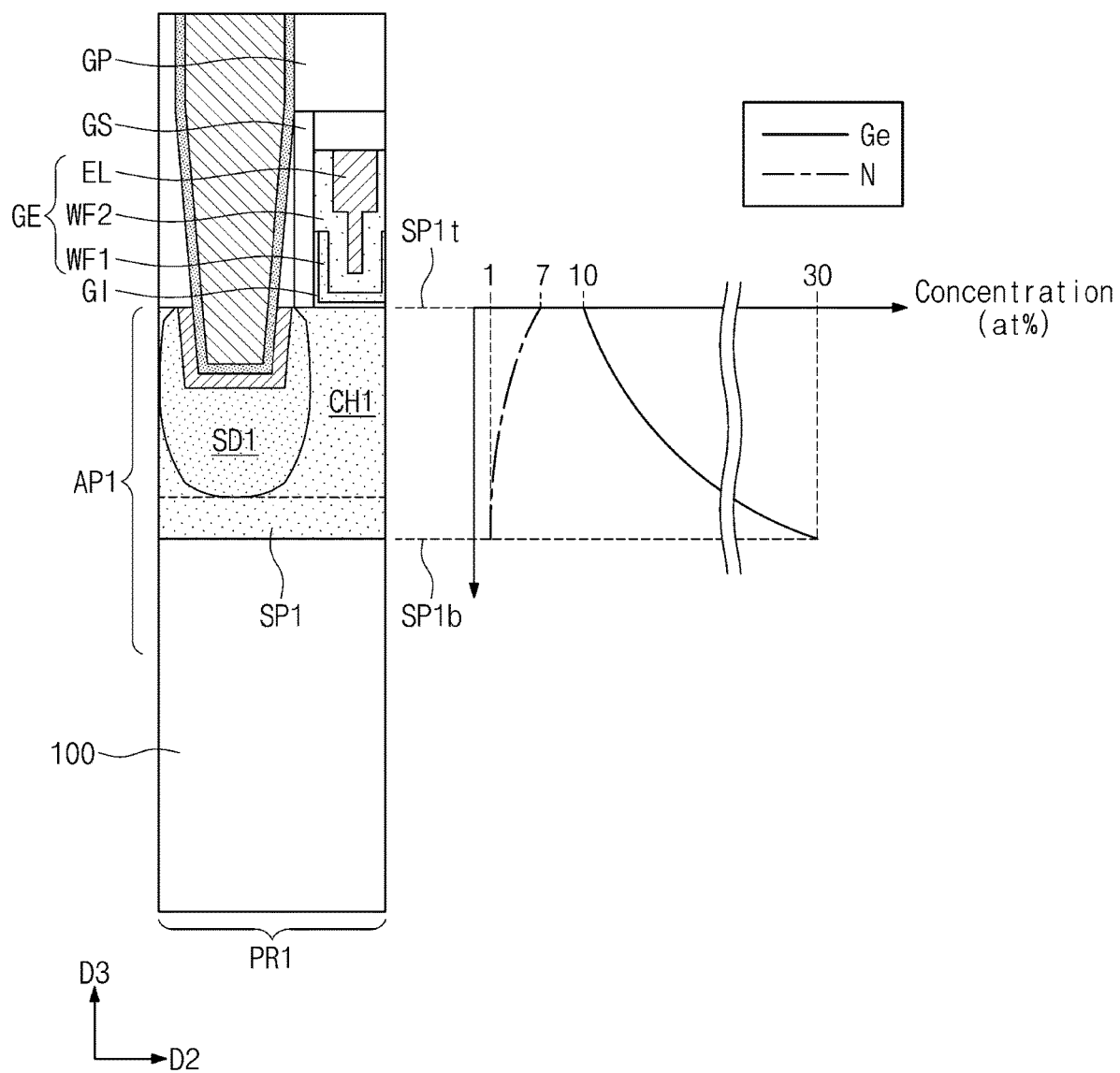
FIG. 3 is an enlarged cross-sectional view of a first active region of FIG. 2A.

FIG. 1 is a plan view illustrating a semiconductor device according to some embodiments of the inventive concepts. FIGS. 2A, 2B, 2C and 2D are cross-sectional views taken along lines A-A', B-B', C-C' and D-D' of FIG. 1, respectively. FIG. 3 is an enlarged cross-sectional view of a first active region of FIG. 2A.

Referring to FIGS. 1 and 2A to 2D, a substrate 100 including a PMOSFET region PR and an NMOSFET region NR may be provided. The substrate 100 may be a semiconductor substrate including silicon, germanium, or silicon-germanium or may be a compound semiconductor substrate. In some embodiments, the substrate 100 may be a silicon substrate.

In some embodiments, the PMOSFET region PR and the NMOSFET region NR may be included in a logic cell region on which logic transistors constituting a logic circuit of a semiconductor device are disposed. For example, the logic transistors constituting the logic circuit may be disposed on the logic cell region of the substrate 100. Some of the logic transistors may be disposed on the PMOSFET region PR and/or the NMOSFET region NR.

The PMOSFET region PR and the NMOSFET region NR may be defined by a second trench TR2 formed in an upper portion of the substrate 100. The second trench TR2 may be disposed between the PMOSFET region PR and the NMOSFET region NR. The PMOSFET region PR and the NMOSFET region NR may be spaced apart from each other in a first direction D1 with the second trench TR2 interposed therebetween. Each of the PMOSFET region PR and the NMOSFET region NR may extend in a second direction D2 intersecting the first direction D1. The first direction D1 may be perpendicular to the second direction D2.

The PMOSFET region PR may include a first active region PR1, a second active region PR2, and a third active region PR3. The first to third active regions PR1, PR2 and PR3 may be spaced apart from each other in the second direction D2. An absolute value of a threshold voltage of a PMOS transistor on the first active region PR1 may be higher than an absolute value of a threshold voltage of a PMOS transistor on the second active region PR2. The absolute value of the threshold voltage of the PMOS transistor on the second active region PR2 may be higher than an absolute value of a threshold voltage of a PMOS transistor on the third active region PR3.

First active patterns AP1 may be provided on the PMOSFET region PR, and second active patterns AP2 may be provided on the NMOSFET region NR. The first and second active patterns AP1 and AP2 may extend in the second direction D2. The first and second active patterns AP1 and AP2 may be portions of the substrate 100, which vertically protrude. First trenches TR1 may be defined between the first active patterns AP1 adjacent to each other and between the second active patterns AP2 adjacent to each other. The first trench TR1 may be shallower than the second trench TR2.

A device isolation layer ST may fill the first and second trenches TR1 and TR2. For example, the device isolation layer ST may include a silicon oxide layer. Upper portions of the first and second active patterns AP1 and AP2 may vertically protrude from the device isolation layer ST (see FIG. 2C). Each of the upper portions of the first and second active patterns AP1 and AP2 may have a fin shape. The device isolation layer ST may not cover or extend over the upper portions of the first and second active patterns AP1 and AP2. The device isolation layer ST may cover, overlap, or extend over sidewalls of lower portions of the first and second active patterns AP1 and AP2.

An upper portion of the first active pattern AP1 of the first active region PR1 may include a first semiconductor pattern SP1. An upper portion of the first active pattern AP1 of the second active region PR2 may include a second semiconductor pattern SP2. An upper portion of the first active pattern AP1 of the third active region PR3 may include a third semiconductor pattern SP3. Each of the first to third semiconductor patterns SP1, SP2 and SP3 may include silicon-germanium (SiGe). Each of the first to third semiconductor patterns SP1, SP2 and SP3 may be used as a first channel pattern CH1 to be described later. In other words, the PMOS transistors according to some embodiments of the inventive concepts may have channels formed of silicon-germanium (SiGe).

The first semiconductor pattern SP1 will be mainly described in detail with reference to FIG. 3. The first semiconductor pattern SP1 may further include nitrogen (N) as impurities. Nitrogen (N) may be diffused into the first semiconductor pattern SP1 in a process of forming the first semiconductor pattern SP1.

A concentration of nitrogen (N) may gradually decrease from a top surface SP1$t$ of the first semiconductor pattern SP1 to a bottom surface SP1$b$ of the first semiconductor pattern SP1. A concentration of nitrogen (N) at the top surface SP1$t$ of the first semiconductor pattern SP1 may range from 6 atomic percent (at %) to 8 at %, and a concentration of nitrogen (N) at the bottom surface SP1$b$ of the first semiconductor pattern SP1 may be 1 at %. For example, the concentration of nitrogen (N) may decrease from 7 at % to 1 at % as a distance from the top surface SP1$t$ toward the bottom surface SP1$b$ increases.

A concentration of germanium (Ge) in the first semiconductor pattern SP1 may gradually increase from the top surface SP1$t$ of the first semiconductor pattern SP1 to the bottom surface SP1$b$ of the first semiconductor pattern SP1. A concentration of germanium (Ge) at the top surface SP1$t$ of the first semiconductor pattern SP1 may range from 5 at % to 15 at %, and a concentration of germanium (Ge) at the bottom surface SP1$b$ of the first semiconductor pattern SP1 may be about 30 at %. For example, the concentration of germanium (Ge) may increase from 10 at % to 30 at % as a distance from the top surface SP1$t$ toward the bottom surface SP1$b$ increases.

Referring again to FIGS. 1 and 2A to 2D, concentrations of nitrogen (N) of the first to third semiconductor patterns SP1, SP2 and SP3 may be different from each other. Here, the concentration of nitrogen (N) may be a concentration measured at the top surface (e.g., SP1$t$ of FIG. 3) of each of the first to third semiconductor patterns SP1, SP2 and SP3.

Like the first semiconductor pattern SP1, a concentration of nitrogen (N) in the second semiconductor pattern SP2 may gradually decrease from its top surface to its bottom surface. The concentration of nitrogen (N) at the top surface of the second semiconductor pattern SP2 may range from 3 at % to 6 at %, and a concentration of nitrogen (N) at the bottom surface of the second semiconductor pattern SP2 may be 1 at %.

Like the first semiconductor pattern SP1, a concentration of nitrogen (N) in the third semiconductor pattern SP3 may gradually decrease from its top surface to its bottom surface. The concentration of nitrogen (N) at the top surface of the third semiconductor pattern SP3 may range from 0 at % to 4 at %. For an example, the third semiconductor pattern SP3 may not include nitrogen (N).

Concentrations of germanium (Ge) of the first to third semiconductor patterns SP1, SP2 and SP3 may be different from each other. Here, the concentration of germanium (Ge) may be a concentration measured at the top surface (e.g., SP1$t$ of FIG. 3) of each of the first to third semiconductor patterns SP1, SP2 and SP3. The concentration of germanium (Ge) of the first semiconductor pattern SP1 may be lower than the concentration of germanium (Ge) of the second semiconductor pattern SP2. The concentration of germanium (Ge) of the second semiconductor pattern SP2 may be lower than the concentration of germanium (Ge) of the third semiconductor pattern SP3. For example, the concentration of germanium (Ge) of the first semiconductor pattern SP1 may range from 5 at % to 15 at %. The concentration of germanium (Ge) of the second semiconductor pattern SP2 may range from 10 at % to 20 at %. The concentration of germanium (Ge) of the third semiconductor pattern SP3 may range from 20 at % to 30 at %.

The first to third semiconductor patterns SP1, SP2 and SP3 may be provided in the upper portion of the first active pattern AP1. The first to third semiconductor patterns SP1, SP2 and SP3 may not be provided in an upper portion of the second active pattern AP2. Thus, the upper portion of the second active pattern AP2 may include silicon (Si).

First source/drain patterns SD1 may be provided in the upper portion of the first active pattern AP1. The first source/drain patterns SD1 may be dopant regions having a first conductivity type (e.g., a P-type). A first channel pattern CH1 may be disposed between a pair of the first source/drain patterns SD1. The bottom surface of each of the first to third semiconductor patterns SP1, SP2 and SP3 may be lower than a bottom surface of each of the first source/drain patterns SD1. In some embodiments, such as FIG. 2D, the first source/drain patterns SD1 may be merged together.

Second source/drain patterns SD2 may be provided in the upper portions of the second active patterns AP2. The second source/drain patterns SD2 may be dopant regions having a second conductivity type (e.g., an N-type). A second channel pattern CH2 may be disposed between a pair of the second source/drain patterns SD2. In some embodiments, such as FIG. 2D, the second source/drain patterns SD2 may be merged together.

The first and second source/drain patterns SD1 and SD2 may include epitaxial patterns formed by a selective epitaxial growth (SEG) process. In some embodiments, a top surface of each of the first and second source/drain patterns SD1 and SD2 may be disposed at substantially the same level as a top surface of each of the first and second channel patterns CH1 and CH2.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel patterns CH1. The second source/drain patterns SD2 may include the same semiconductor element (e.g., silicon) as the substrate 100.

Gate electrodes GE may extend in the first direction D1 to intersect the first and second active patterns AP1 and AP2. The gate electrodes GE may be spaced apart from each other in the second direction D2. The gate electrodes GE may vertically overlap with the first and second channel patterns CH1 and CH2 in the third direction D3.

Referring again to FIG. 2C, the gate electrode GE may be provided on a first top surface TS1 of the first channel pattern CH1 and at least one first sidewall SW1 of the first channel pattern CH1. The gate electrode GE may be provided on a second top surface TS2 of the second channel pattern CH2 and at least one second sidewall SW2 of the second channel pattern CH2. In other words, the transistors according to some embodiments may be three-dimensional (3D) field effect transistors (e.g., FinFETs) in which the gate electrode GE three-dimensionally surrounds channels CH1 and CH2.

Referring again to FIGS. 1 and 2A to 2D, a pair of gate spacers GS may be disposed on both sidewalls of each of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110 to be described later. The gate spacers GS may include at least one of SiCN, SiCON, or SiN. In certain embodiments, each of the gate spacers GS may have a multi-layered structure formed of at least two of SiCN, SiCON, or SiN.

A gate capping pattern GP may be provided on each of the gate electrodes GE. The gate capping pattern GP may extend along the gate electrode GE in the first direction D1. The gate capping patterns GP may include a material having an etch selectivity with respect to first and second interlayer insulating layers 110 and 120 to be described later. For example, the gate capping patterns GP may include at least one of SiON, SiCN, SiCON, or SiN.

A gate dielectric pattern GI may be disposed between the gate electrode GE and the first active pattern AP1 and between the gate electrode GE and the second active pattern AP2. The gate dielectric pattern GI may extend along a bottom surface of the gate electrode GE thereon. For example, the gate dielectric pattern GI may cover the top surface and both sidewalls of the first channel pattern CH1. The gate dielectric pattern GI may cover the top surface and both sidewalls of the second channel pattern CH2. The gate dielectric pattern GI may cover a top surface of the device isolation layer ST under the gate electrode GE (see FIG. 2C).

In some embodiments, the gate dielectric pattern GI may include a high-k dielectric material of which a dielectric constant is higher than that of silicon oxide. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

In some embodiments, the gate dielectric pattern GI may include a ferroelectric material. The gate dielectric pattern GI including the ferroelectric material may function as a negative capacitor. Negative capacitance occurs when a change in charge causes the net voltage across a material to change in the opposite direction. In other words, a decrease in voltage leads to an increase in charge. For example, when an external voltage is applied to the ferroelectric material, a negative capacitance effect by a phase change from an initial polarity state to another state may be generated by movement of dipoles in the ferroelectric material. In this case, a total capacitance of the transistor including the ferroelectric material in the embodiments may be increased, and thus a sub-threshold swing characteristic of the transistor may be improved and an operating voltage of the transistor may be reduced.

The ferroelectric material of the gate dielectric pattern GI may include hafnium oxide doped with (or containing) at least one of zirconium (Zr), silicon (Si), aluminum (Al), or lanthanum (La). Since hafnium oxide is doped with at least one of zirconium (Zr), silicon (Si), aluminum (Al), or lanthanum (La) at a predetermined ratio, at least a portion of the ferroelectric material may have an orthorhombic crystal structure. When at least a portion of the ferroelectric material has the orthorhombic crystal structure, the negative capacitance effect may be generated. A volume ratio of a portion having the orthorhombic crystal structure in the ferroelectric material may range from 10% to 50%.

When the ferroelectric material includes zirconium-doped hafnium oxide (ZrHfO), a ratio of Zr atoms to a sum of Zr atoms and Hf atoms (Zr/(Hf+Zr)) may range from 45 at % to 55 at %. When the ferroelectric material includes silicon-doped hafnium oxide (SiHfO), a ratio of Si atoms to a sum of Si atoms and Hf atoms (Si/(Hf+Si)) may range from 4 at % to 6 at %. When the ferroelectric material includes aluminum-doped hafnium oxide (AlHfO), a ratio of Al atoms to a sum of Al atoms and Hf atoms (Al/(Hf+Al)) may range from 5 at % to 10 at %. When the ferroelectric material includes lanthanum-doped hafnium oxide (LaHfO), a ratio of La atoms to a sum of La atoms and Hf atoms (La/(Hf+La)) may range from 5 at % to 10 at %.

Each of the gate electrodes GE may include a first metal pattern WF1, a second metal pattern WF2, and an electrode pattern EL. The first metal pattern WF1 may be provided on the gate dielectric pattern GI. For example, the gate dielectric pattern GI may be disposed between the first metal pattern WF1 and the first channel pattern CH1.

The gate dielectric pattern GI and the first metal pattern WF1 may be chamfered (i.e., cut away at a right-angled edge or corner to make a symmetrical sloping edge), and thus upper portions thereof may be lower than the topmost surface GEt of the gate electrode GE. For example, the first metal pattern WF1 may have a recessed top surface RSt, and the recessed top surface RSt may be lower than the topmost surface GEt of the gate electrode GE.

The first metal pattern WF1 may include a metal nitride having a relatively high work function. The work function is the minimum amount of energy required to make the free electrons escape from the metal surface. If a material has a high work function, then a high amount of energy may be needed to make electrons escape from the metal surface. The first metal pattern WF1 may include a P-type work function metal. For example, the first metal pattern WF1 may include titanium nitride (TiN), tantalum nitride (TaN), titanium oxynitride (TiON), titanium-silicon nitride (TiSiN), titanium-aluminum nitride (TiAlN), tungsten carbonitride (WCN), and/or molybdenum nitride (MoN).

The second metal pattern WF2 may be provided on the first metal pattern WF1. The second metal pattern WF2 may cover or extend over the recessed top surface RSt of the first metal pattern WF1. The second metal pattern WF2 may include a metal carbide having a relatively low work function. In other words, the second metal pattern WF2 may include an N-type work function metal. The second metal pattern WF2 may include a metal carbide doped with (or containing) silicon and/or aluminum. For example, the second metal pattern WF2 may include aluminum-doped titanium carbide (TiAlC), aluminum-doped tantalum carbide (TaAlC), aluminum-doped vanadium carbide (VAlC), silicon-doped titanium carbide (TiSiC), and/or silicon-doped tantalum carbide (TaSiC). For other examples, the second metal pattern WF2 may include titanium carbide doped with aluminum and silicon (TiAlSiC), or tantalum carbide doped with aluminum and silicon (TaAlSiC). For still another example, the second metal pattern WF2 may include aluminum-doped titanium (TiAl).

In the second metal pattern WF2, the work function of the second metal pattern WF2 may be adjusted by adjusting a doping concentration of silicon or aluminum corresponding to a dopant. For example, a concentration of the dopant (e.g., silicon or aluminum) in the second metal pattern WF2 may range from 0.1 at % to 25 at %.

The electrode pattern EL may be provided on the second metal pattern WF2. A resistance of the electrode pattern EL may be lower than respective resistances of the first and second metal patterns WF1 and WF2. For example, the electrode pattern EL may include a low-resistance metal including at least one of aluminum (Al), tungsten (W), titanium (Ti), or tantalum (Ta).

According to some embodiments of the inventive concepts, the first and second metal patterns WF1 and WF2 may be adjacent to the first channel pattern CH1. The first and second metal patterns WF1 and WF2 may function as a work function metal for adjusting the threshold voltage of the PMOS transistor. In other words, a desired threshold voltage may be obtained by adjusting a thickness and/or a composition of each of the first and second metal patterns WF1 and WF2.

A thickness of the first metal pattern WF1 on the second active region PR2 may be greater than a thickness of the first metal pattern WF1 on the first active region PR1. A thickness of the first metal pattern WF1 on the third active region PR3 may be greater than the thickness of the first metal pattern WF1 on the second active region PR2. As discussed herein, the thickness of the first metal pattern WF1 may be a width, in the second direction D2, of an upper portion of the first metal pattern WF1 adjacent to the gate spacer GS.

The thicknesses of the first metal patterns WF1 may sequentially increase from the first active region PR1 to the third active region PR3. In other words, effective work functions (eWF) of the gate electrodes GE may sequentially increase from the first active region PR1 to the third active region PR3. Thus, the absolute values of the threshold voltages of the PMOS transistors may sequentially decrease from the first active region PR1 to the third active region PR3.

In addition, the effective work functions of the gate electrodes GE may also be adjusted by the concentrations of germanium (Ge) of the first to third semiconductor patterns SP1, SP2 and SP3. The effective work function of the gate electrode GE may increase as the concentration of germanium (Ge) of the semiconductor pattern SP1, SP2 or SP3 increases. Since the concentrations of germanium (Ge) of the first to third semiconductor patterns SP1, SP2 and SP3 increase in the order listed, the effective work functions of the gate electrodes GE may sequentially increase from the first active region PR1 to the third active region PR3. Thus, the absolute values of the threshold voltages of the PMOS transistors may sequentially decrease from the first active region PR1 to the third active region PR3.

In detail, the concentration of germanium (Ge) of the third semiconductor pattern SP3 of the third active region PR3 may be greater than the concentration of germanium (Ge) of the first semiconductor pattern SP1 of the first active region PR1. In addition, the thickness of the first metal pattern WF1 on the third active region PR3 may be greater than the thickness of the first metal pattern WF1 on the first active region PR1. The effective work function of the gate electrode GE on the third active region PR3 may be relatively increased by interaction of the thickness of the first metal pattern WF1 on the third active region PR3 and the concentration of germanium (Ge) of the third semiconductor pattern SP3. The effective work function of the gate electrode GE on the first active region PR1 may be relatively decreased by interaction of the thickness of the first metal pattern WF1 on the first active region PR1 and the concentration of germanium (Ge) of the first semiconductor pattern SP1. As a result, the absolute value of the threshold voltage of the PMOS transistor on the third active region PR3 may be much lower than the absolute value of the threshold voltage of the PMOS transistor on the first active region PR1.

A first interlayer insulating layer 110 may be provided on the substrate 100. The first interlayer insulating layer 110 may cover or extend over the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. A second interlayer insulating layer 120 may be disposed on the first interlayer insulating layer 110 and the gate capping patterns GP. For example, each of the first and second interlayer insulating layers 110 and 120 may include a silicon oxide layer.

Active contacts AC may penetrate the second and first interlayer insulating layers 120 and 110 so as to be electrically connected to the first and second source/drain patterns SD1 and SD2. Each of the active contacts AC may be provided between a pair of the gate electrodes GE.

The active contact AC may be a self-aligned contact. In other words, the active contact AC may be formed to be self-aligned using the gate capping pattern GP and the gate spacer GS. For example, the active contact AC may cover, overlap, or extend over at least a portion of a sidewall of the gate spacer GS. Even though not shown in the drawings, the active contact AC may cover or extend over a portion of the top surface of the gate capping pattern GP.

Silicide patterns SC may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or a cobalt silicide.

The active contact AC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover a bottom surface and sidewalls of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A third interlayer insulating layer 130 may be provided on the second interlayer insulating layer 120. A first metal layer may be provided in the third interlayer insulating layer 130. The first metal layer may include first interconnection lines M1, first vias V1, and second vias V2. The first and second vias V1 and V2 may be provided under the first interconnection lines M1.

The first interconnection lines M1 may extend in the second direction D2 in parallel to each other. The first interconnection lines M1 may be arranged in the first direction D1. The first via V1 may be disposed between the active contact AC and a corresponding one of the first interconnection lines M1 to electrically connect the active contact AC to the corresponding one of the first interconnection lines M1. The second via V2 may be disposed between the gate electrode GE and a corresponding one of the first interconnection lines M1 to electrically connect the gate electrode GE to the corresponding one of the first interconnection lines M1.

For example, the first interconnection line M1 and the first or second via V1 or V2 disposed thereunder may be connected to each other to constitute a single unitary conductive structure. In other words, the first interconnection line M1 and the first or second via V1 or V2 may be formed together. The first interconnection line M1 and the first or second via V1 or V2 may be formed as the single unitary conductive structure by using a dual damascene process. Even though not shown in the drawings, stacked metal layers may be additionally disposed on the third interlayer insulating layer 130.

Figure 15A:
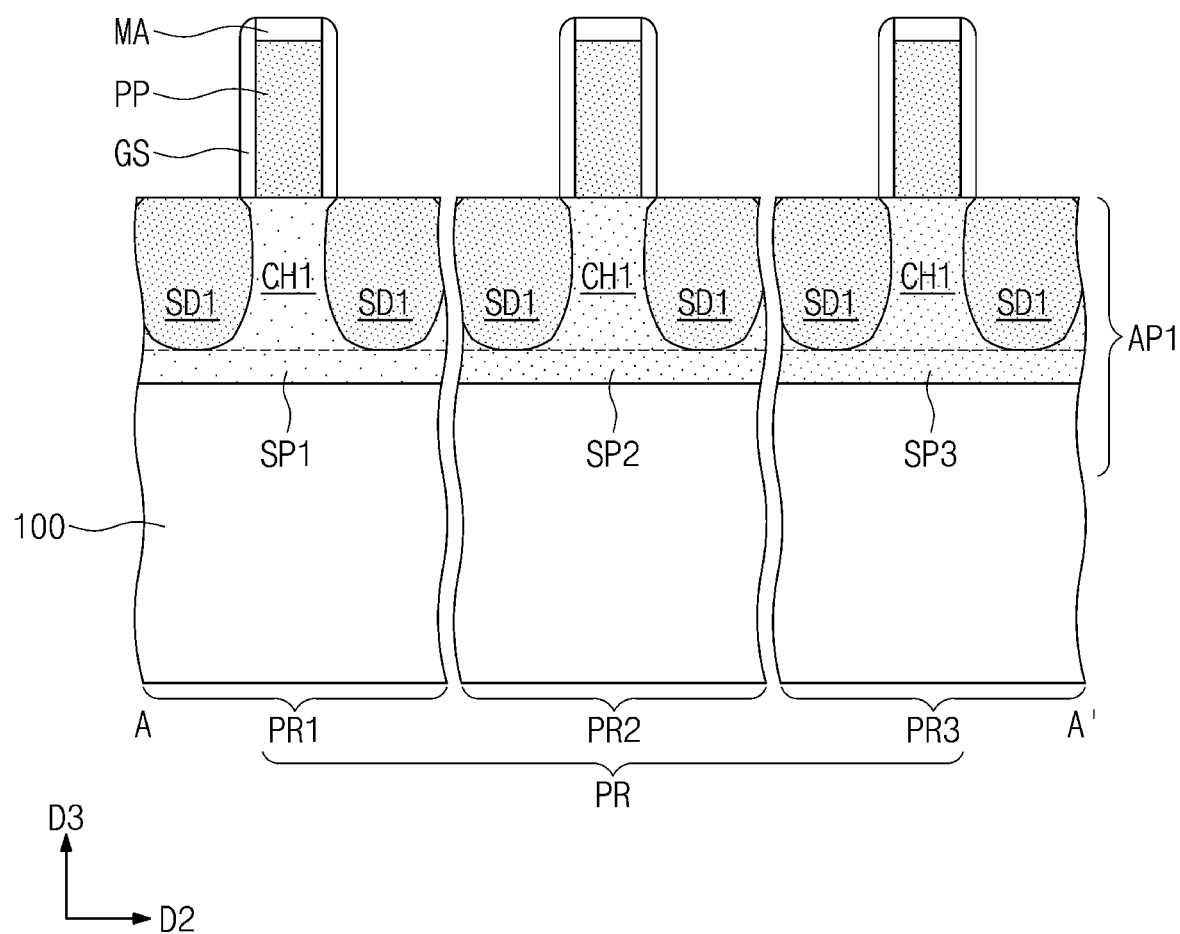
Figure 15B:
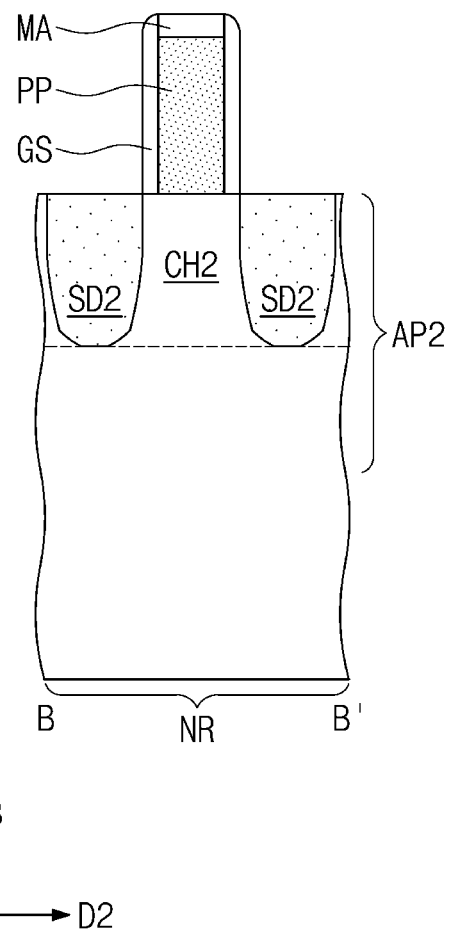
Figure 15C:
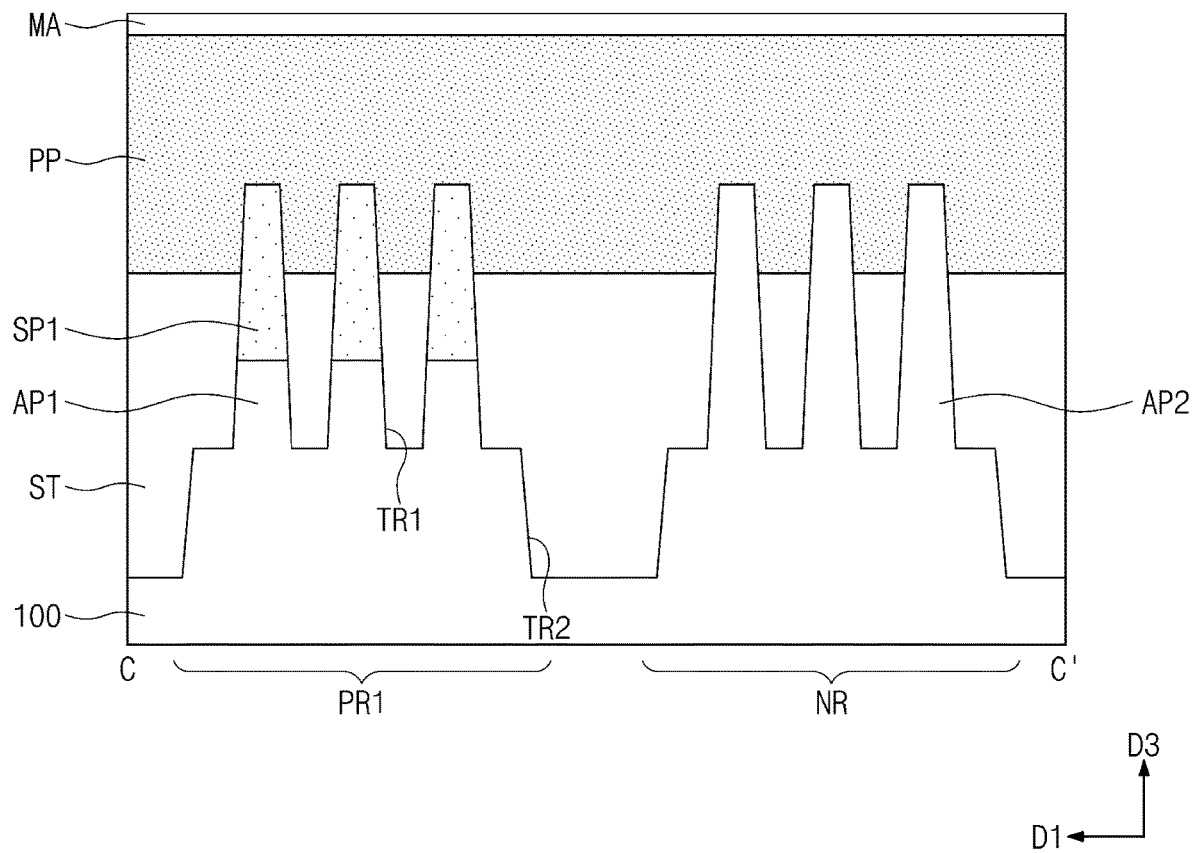
FIGS. 15C and 17C are cross-sectional views taken along lines C-C' of FIGS. 14 and 16, respectively.
Figure 15D:
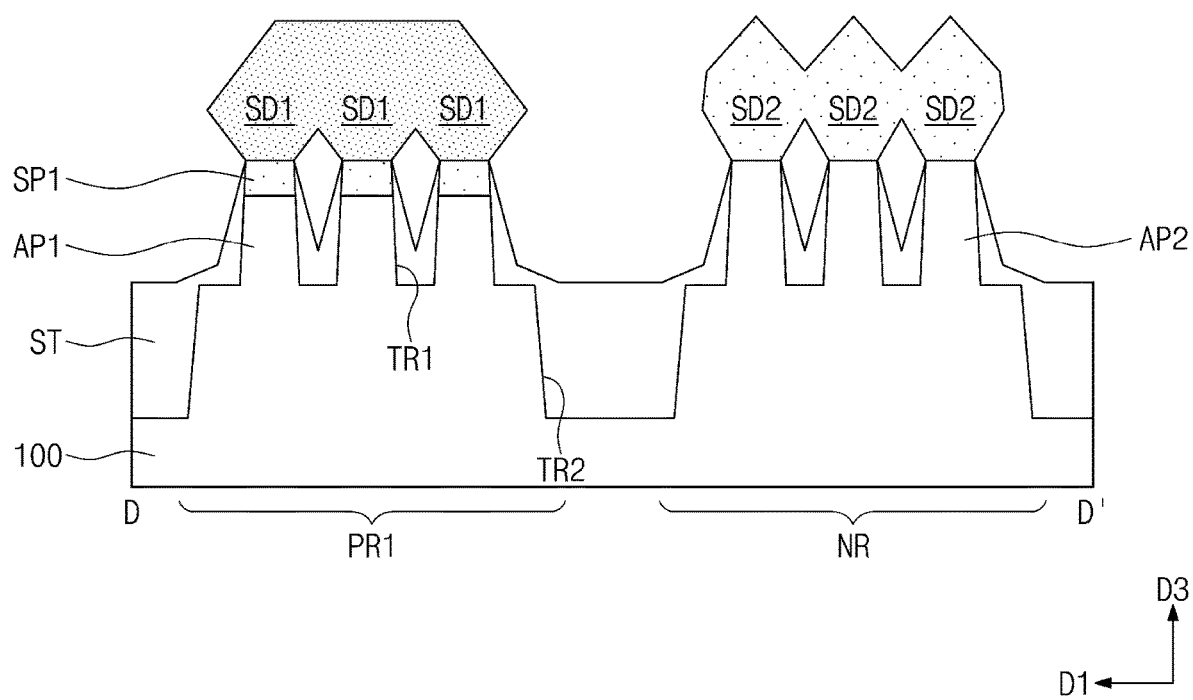
FIGS. 15D and 17D are cross-sectional views taken along lines D-D' of FIGS. 14 and 16, respectively.
Figure 17A:
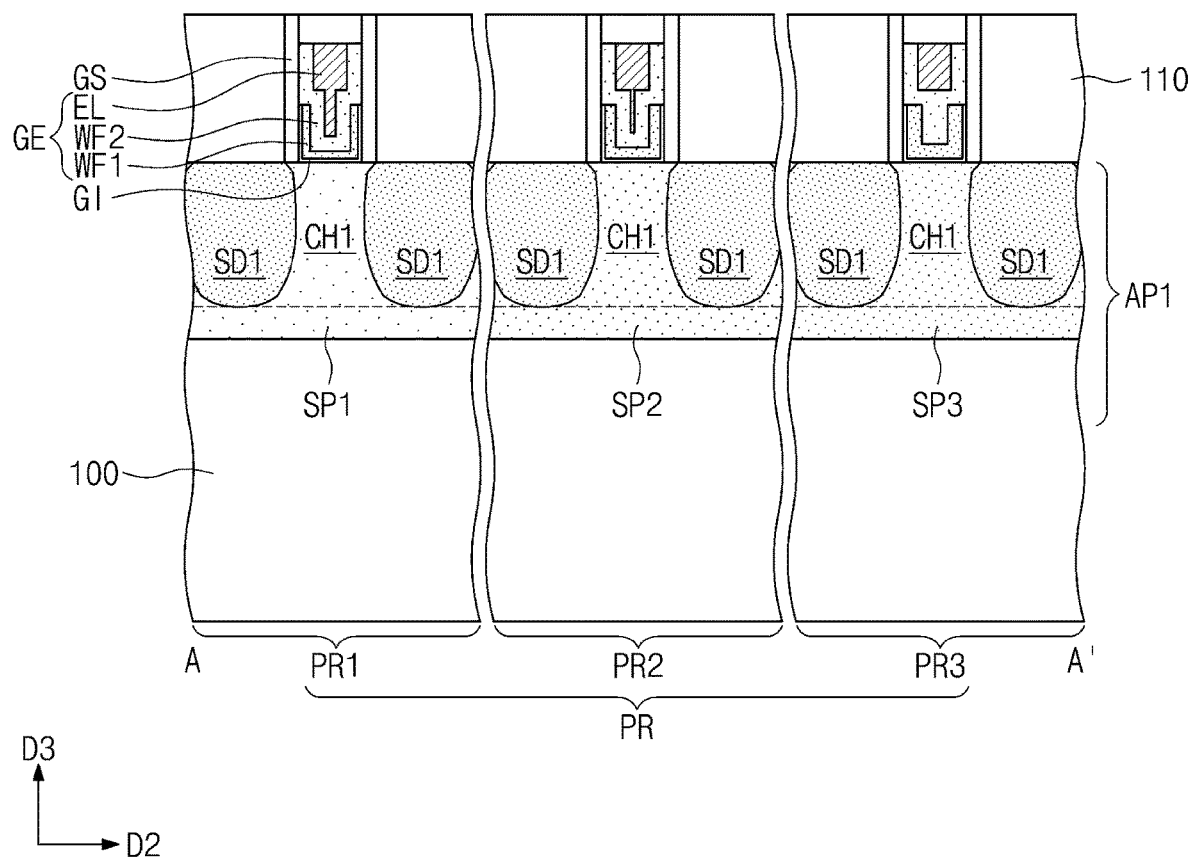
Figure 17B:
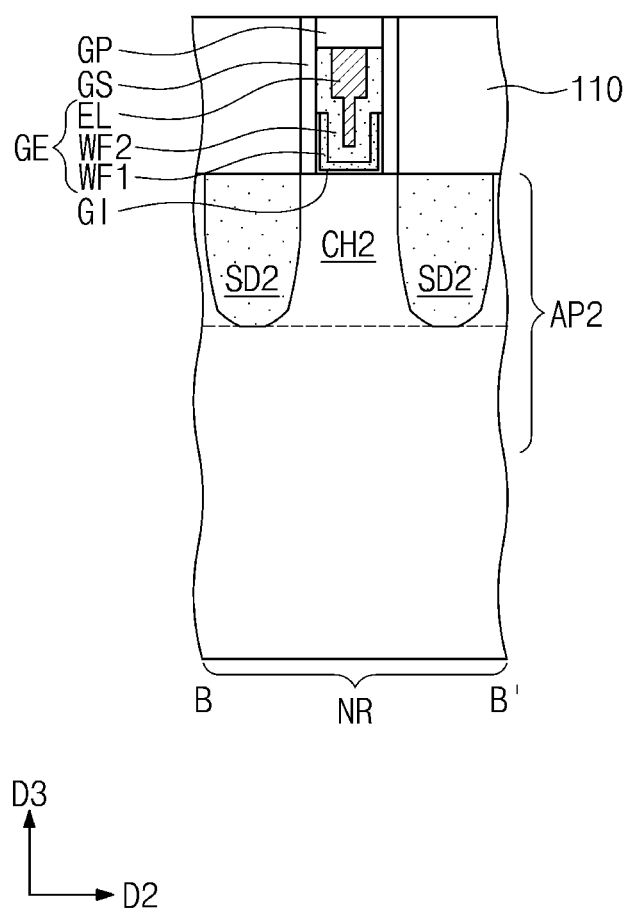
Figure 17C:
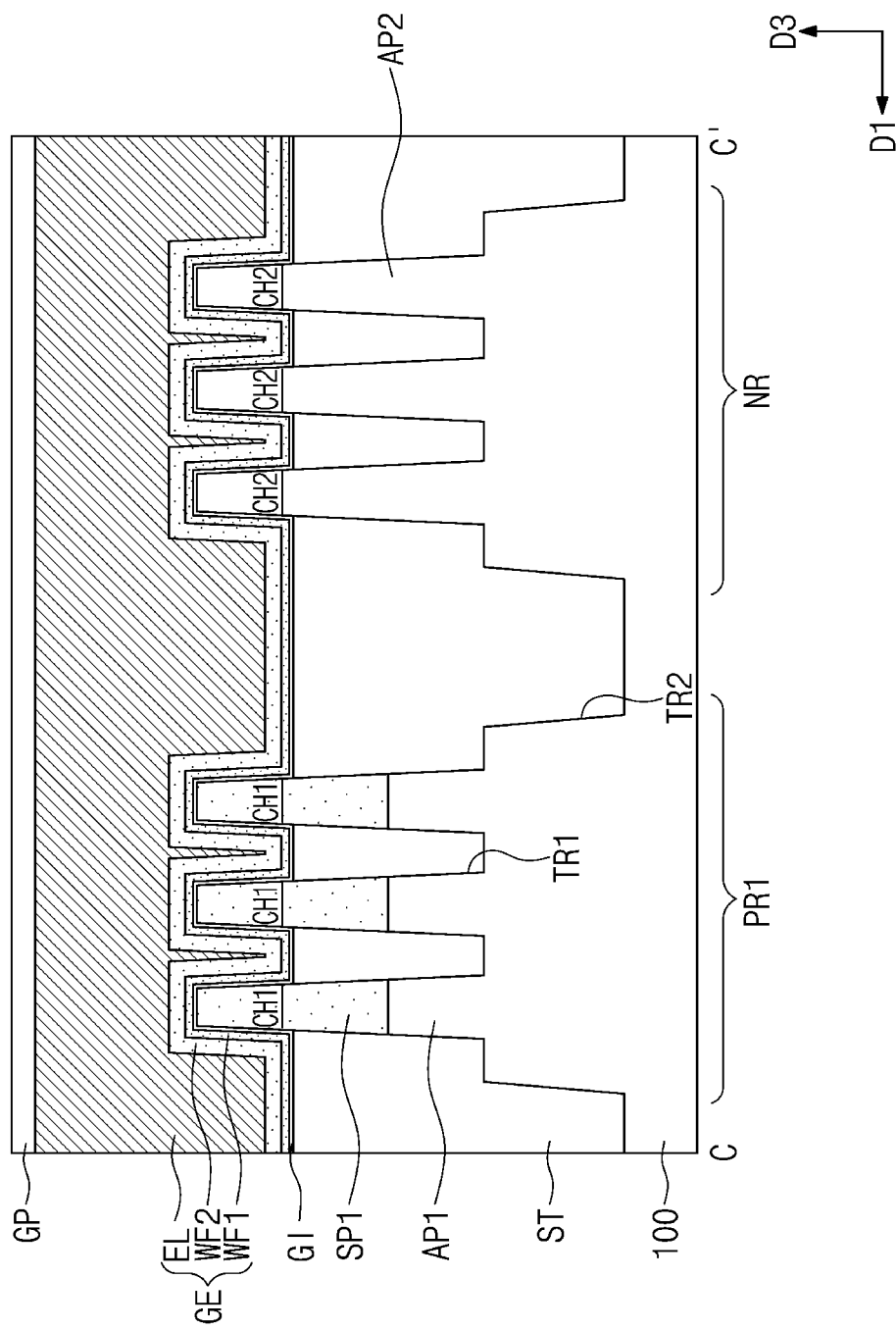
Figure 17D:
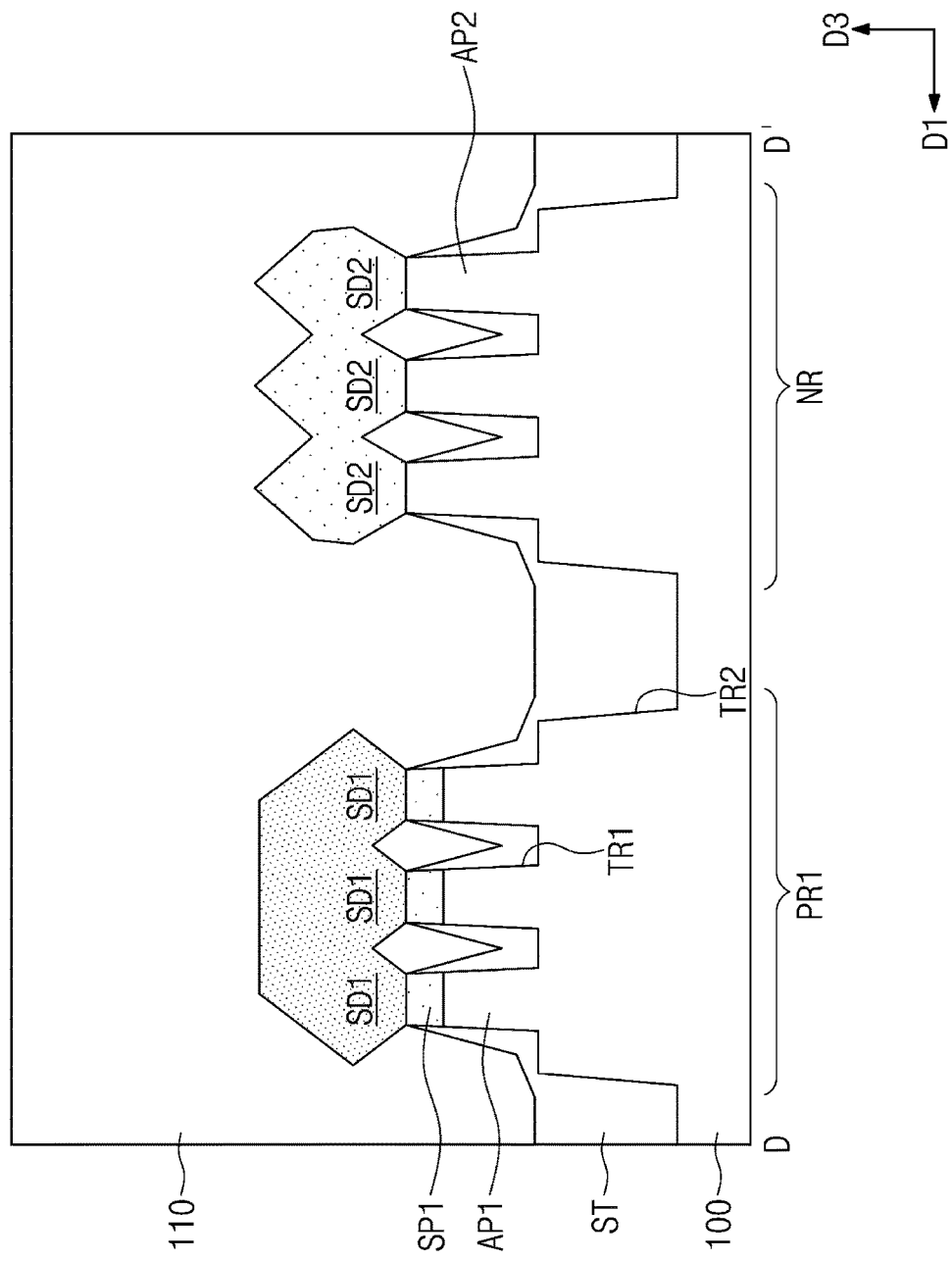

FIGS. 4, 6, 8, 10, 12, 14 and 16 are plan views illustrating a method for manufacturing a semiconductor device according to some embodiments of the inventive concepts. FIGS. 5A, 7A, 9A, 11A, 13A, 15A and 17A are cross-sectional views taken along lines A-A' of FIGS. 4, 6, 8, 10, 12, 14 and 16, respectively. FIGS. 5B, 7B, 9B, 11B, 13B, 15B and 17B are cross-sectional views taken along lines B-B' of FIGS. 4, 6, 8, 10, 12, 14 and 16, respectively. FIGS. 15C and 17C are cross-sectional views taken along lines C-C' of FIGS. 14 and 16, respectively. FIGS. 15D and 17D are cross-sectional views taken along lines D-D' of FIGS. 14 and 16, respectively.

Figure 5A:
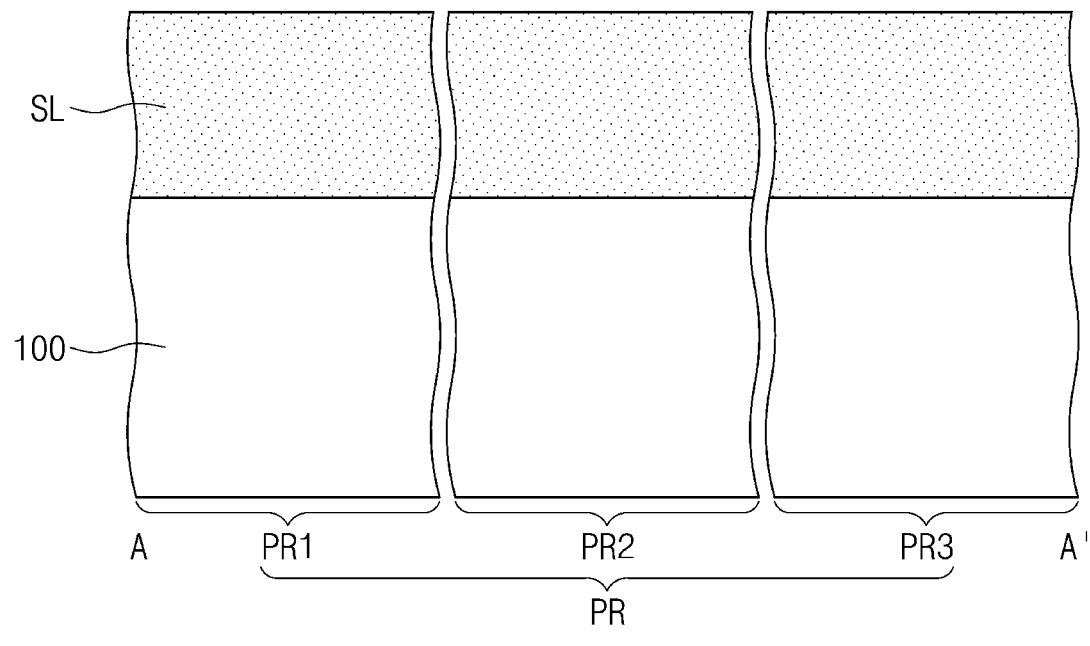
FIGS. 5A, 7A, 9A, 11A, 13A, 15A and 17A are cross-sectional views taken along lines A-A' of FIGS. 4, 6, 8, 10, 12, 14 and 16, respectively.

Referring to FIGS. 4, 5A and 5B, a substrate 100 including a PMOSFET region PR and an NMOSFET region NR may be provided. A semiconductor layer SL may be formed on the PMOSFET region PR of the substrate 100. The formation of the semiconductor layer SL may include forming a trench on the PMOSFET region PR of the substrate 100, and performing a selective epitaxial growth (SEG) process on the PMOSFET region PR to form the semiconductor layer SL filling the trench. The semiconductor layer SL may not be formed on the NMOSFET region NR.

The semiconductor layer SL may include silicon-germanium (SiGe). A concentration of germanium (Ge) of the semiconductor layer SL may range from 20 at % to 30 at %.

Figure 6:
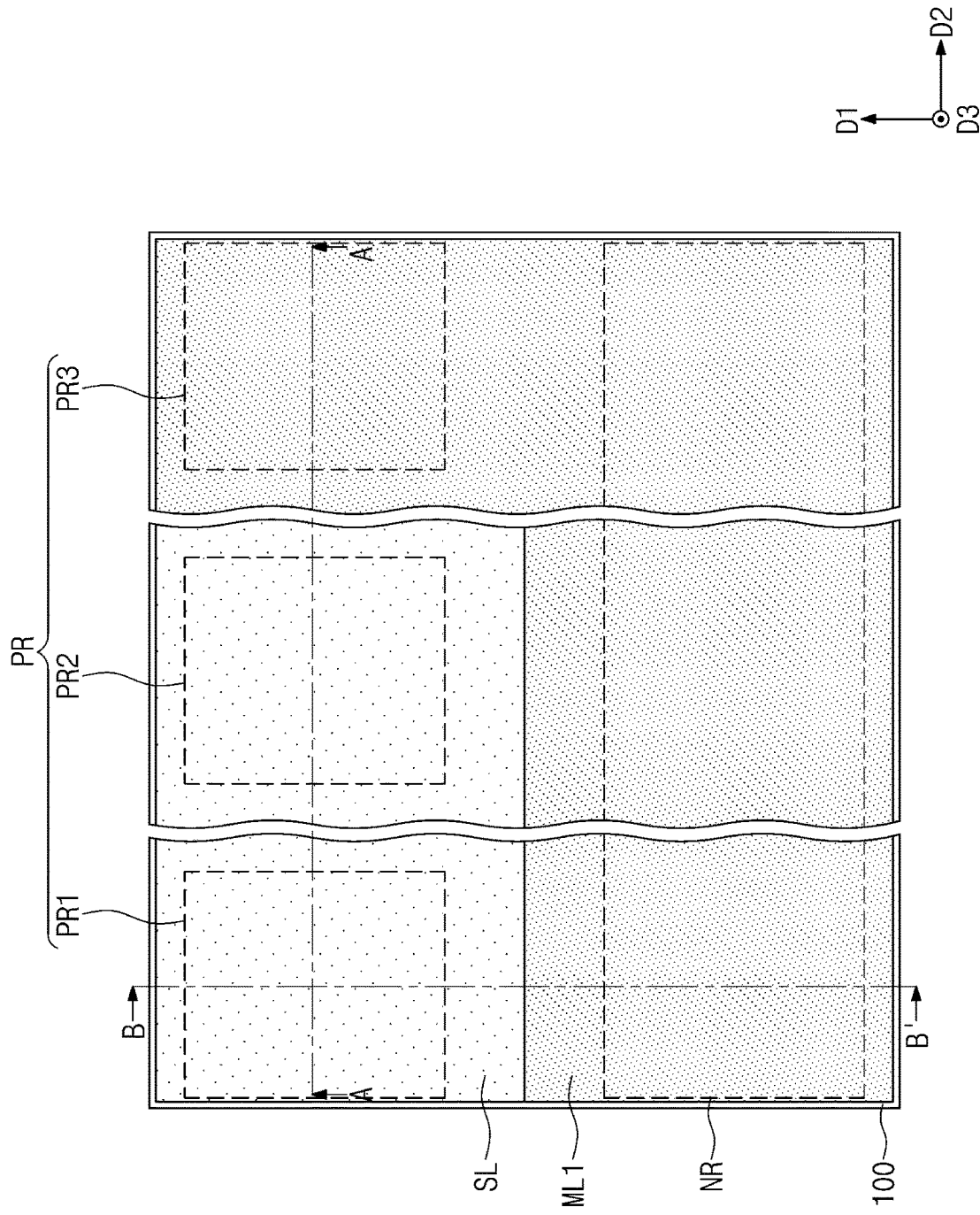
Figure 7A:
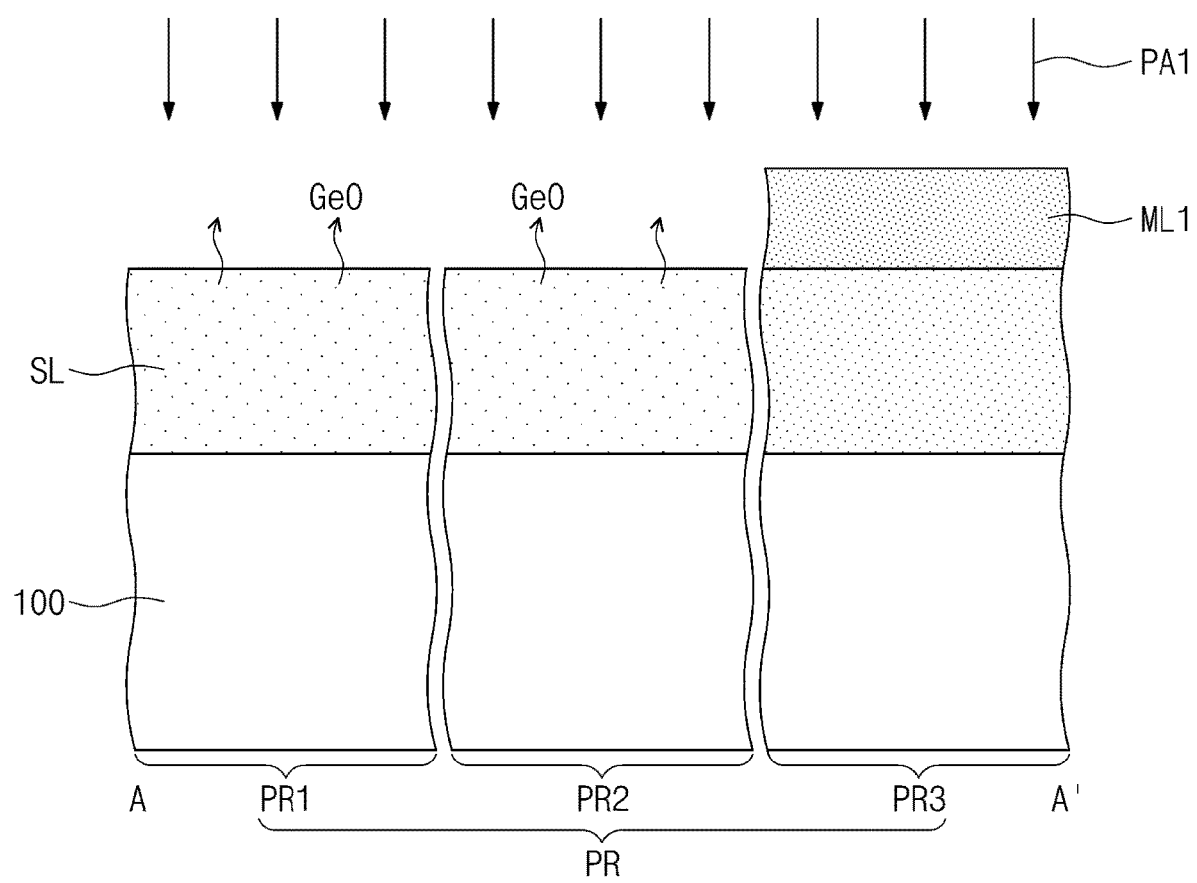
Figure 7B:
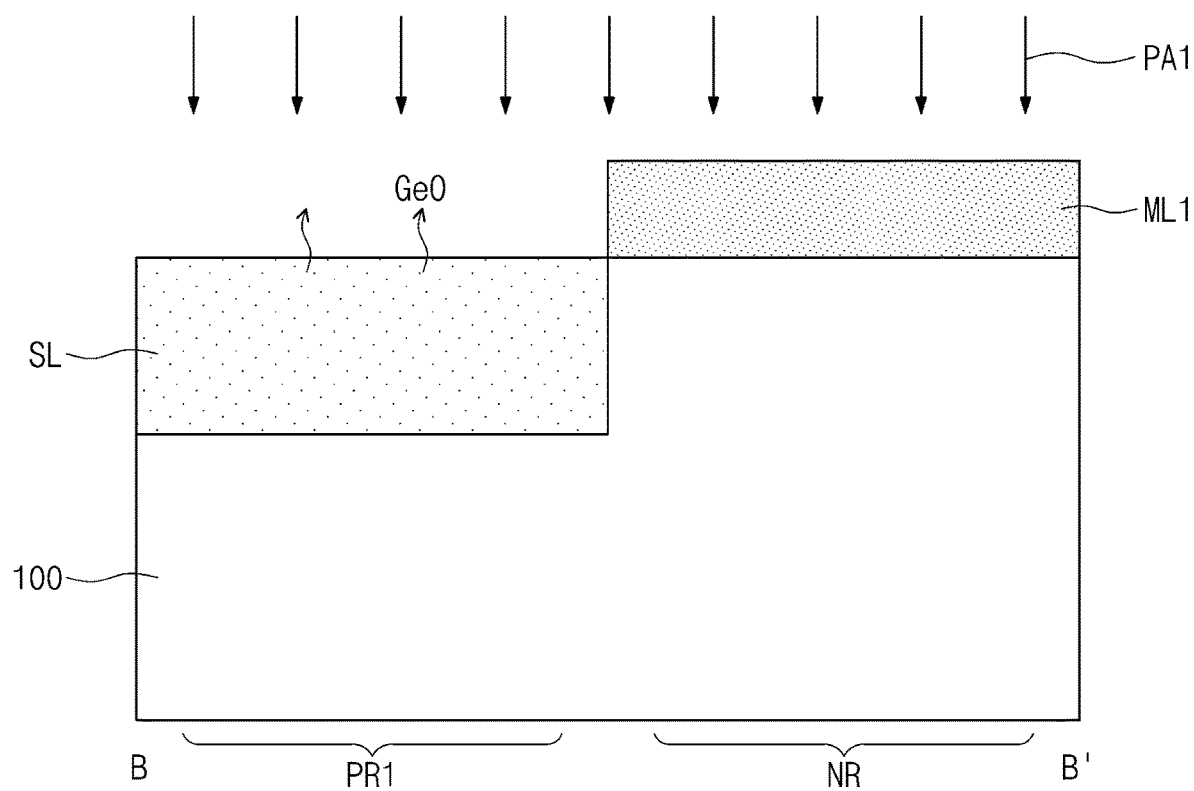

Referring to FIGS. 6, 7A and 7B, a first mask layer ML1 may be formed on the NMOSFET region NR and a third active region PR3 of the PMOSFET region PR. The first mask layer ML1 may expose first and second active regions PR1 and PR2 of the PMOSFET region PR.

A first plasma treatment PA1 may be performed on the first and second active regions PR1 and PR2 exposed by the first mask layer ML1. The first plasma treatment PA1 may include an annealing process using hydrogen plasma. The hydrogen plasma may be provided onto the semiconductor layer SL on the first and second active regions PR1 and PR2, i.e., onto the exposed semiconductor layer SL. At this time, a natural oxide layer (e.g., a germanium oxide (GeO) layer) formed on the exposed semiconductor layer SL may be volatilized by the hydrogen plasma treatment and thus may be removed. In other words, germanium (Ge) of an exposed surface of the semiconductor layer SL may be selectively removed during the first plasma treatment PM. Even though not shown in the drawings, a silicon-rich layer may be formed on the exposed surface of the semiconductor layer SL by the removal of germanium (Ge) of the exposed surface of the semiconductor layer SL.

Due to the first plasma treatment PA1, a concentration of germanium (Ge) of the semiconductor layer SL on the first and second active regions PR1 and PR2 may be reduced as compared with the concentration of germanium (Ge) of the semiconductor layer SL on the third active region PR3. For example, the concentration of germanium (Ge) of the exposed surface of the semiconductor layer SL may be reduced by about 5 at % during the first plasma treatment PM. Germanium (Ge) in the exposed semiconductor layer SL may have a concentration gradient by the first plasma treatment PA1 (see FIG. 3).

Nitrogen (N) may be diffused into the exposed semiconductor layer SL in the first plasma treatment PA1. Nitrogen (N) may be generated from a coating material inside an apparatus for performing the first plasma treatment PM. Since nitrogen (N) is diffused into the exposed semiconductor layer SL, nitrogen (N) in the exposed semiconductor layer SL may have a concentration gradient (see FIG. 3).

Figure 8:
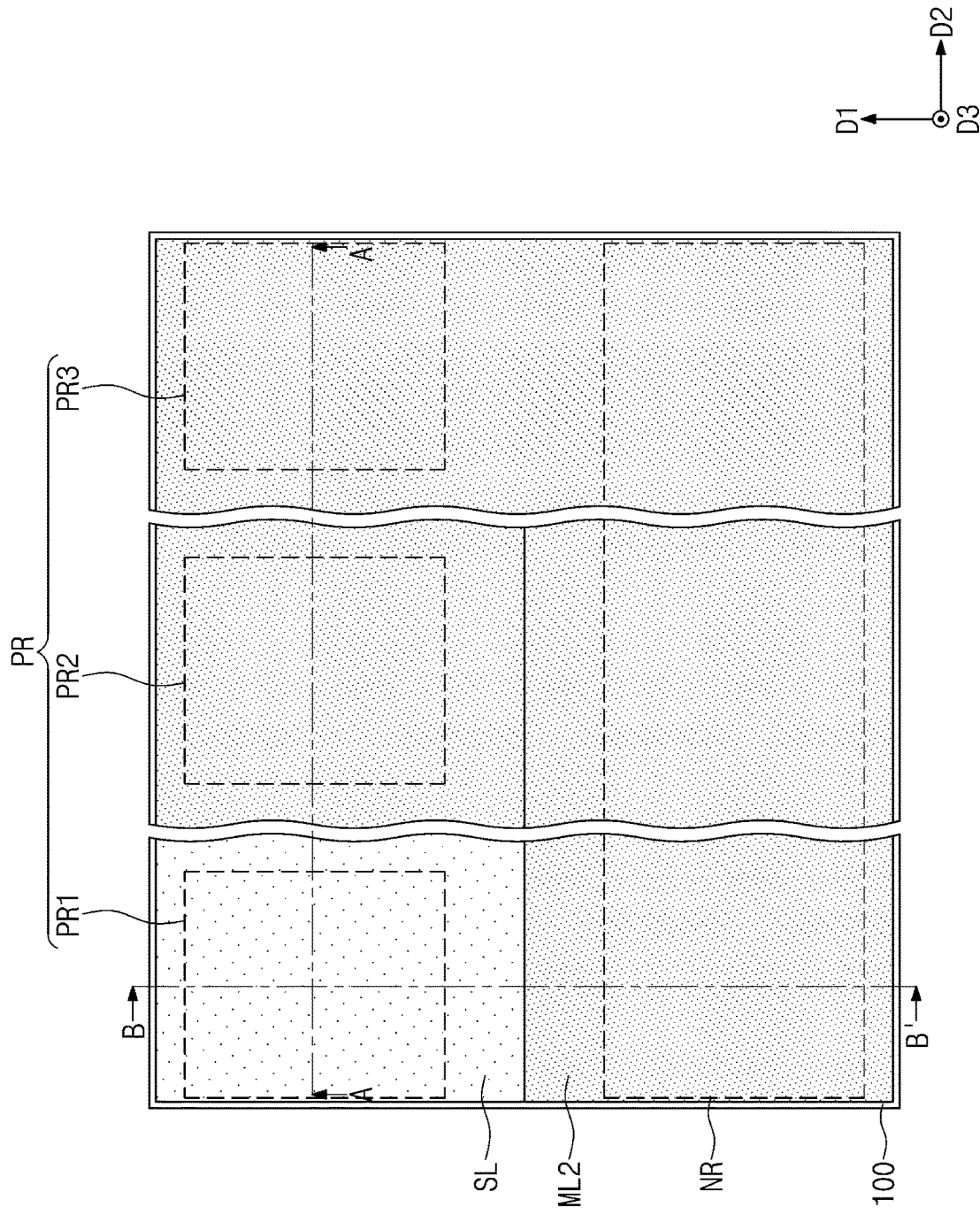
Figure 9A:
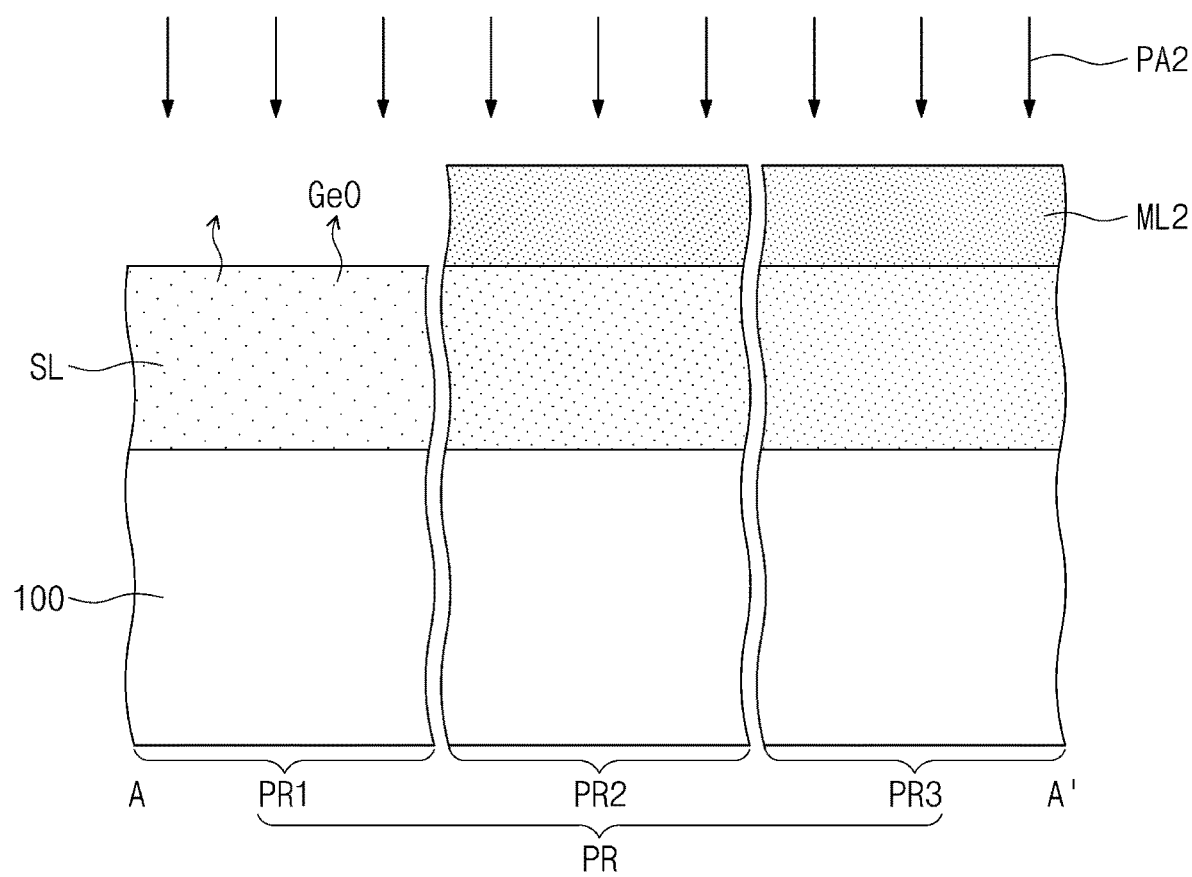
Figure 9B:
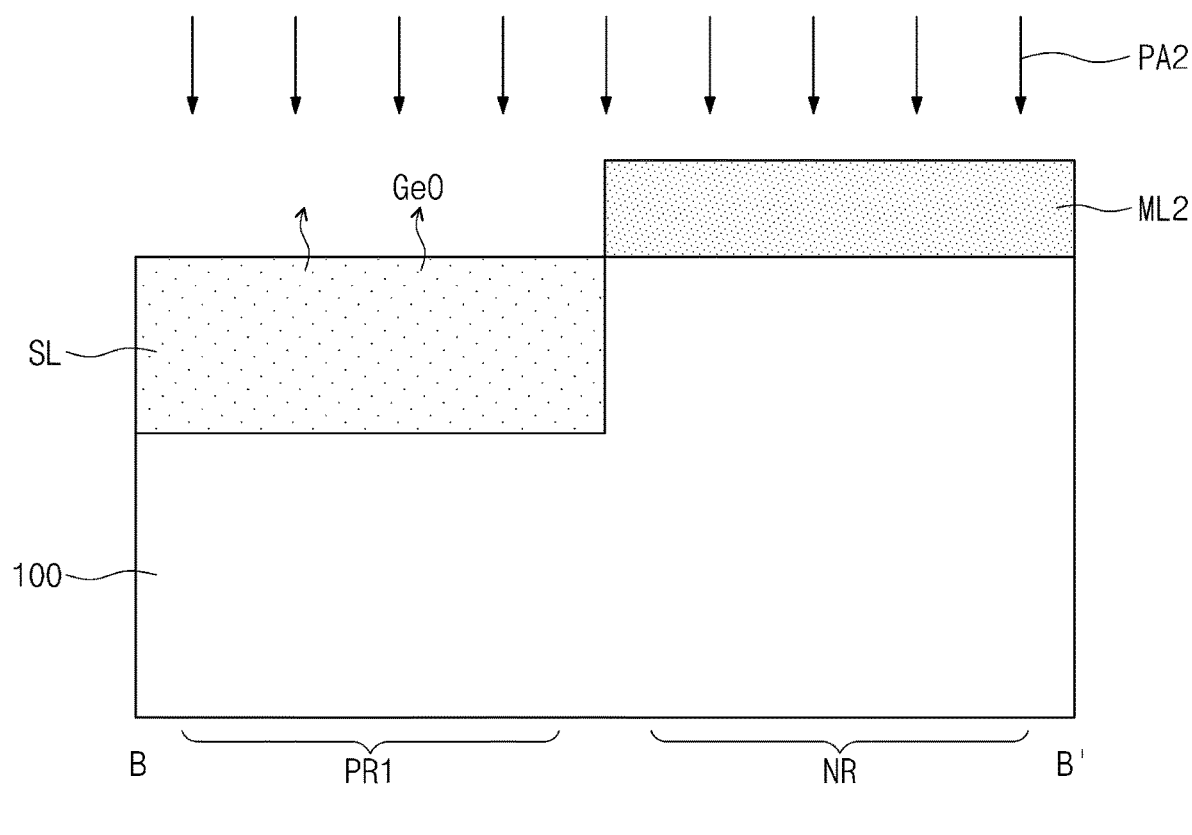

Referring to FIGS. 8, 9A and 9B, the first mask layer ML1 may be removed. A second mask layer ML2 may be formed on the NMOSFET region NR and the second and third active regions PR2 and PR3 of the PMOSFET region PR. The second mask layer ML2 may expose the first active region PR1 of the PMOSFET region PR.

A second plasma treatment PA2 may be performed on the first active region PR1 exposed by the second mask layer ML2. The second plasma treatment PA2 may include an annealing process using hydrogen plasma. The second plasma treatment PA2 may be substantially the same as the first plasma treatment PA1 described above.

Due to the second plasma treatment PA2, a concentration of germanium (Ge) of the semiconductor layer SL on the first active region PR1 may be reduced as compared with the concentration of germanium (Ge) of the semiconductor layer SL on the second active region PR2. For example, the concentration of germanium (Ge) of the exposed surface of the semiconductor layer SL may be reduced by about 5 at % during the second plasma treatment PA2.

As a result, the semiconductor layer SL of the first active region PR1, on which the first and second plasma treatments PA1 and PA2 are performed, may have the lowest germanium concentration. The semiconductor layer SL of the third active region PR3, on which the first and second plasma treatments PA1 and PA2 are not performed, may have the highest germanium concentration.

Figure 11A:
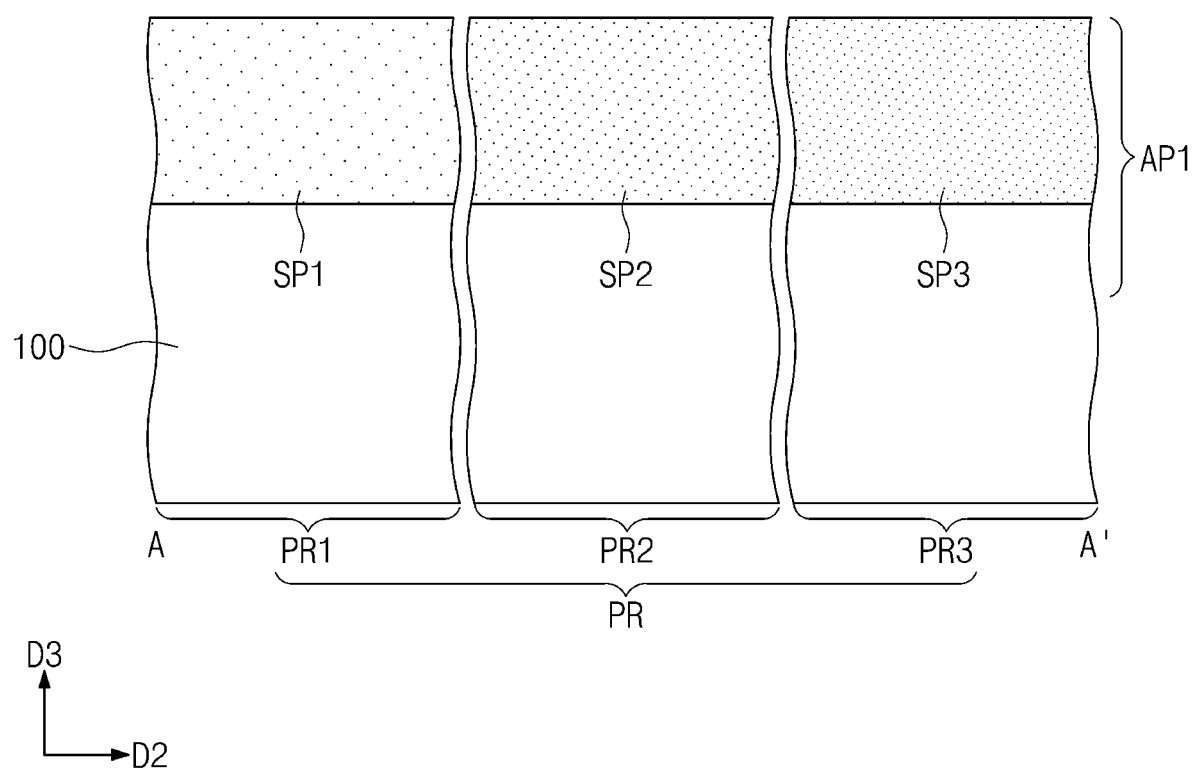
Figure 11B:
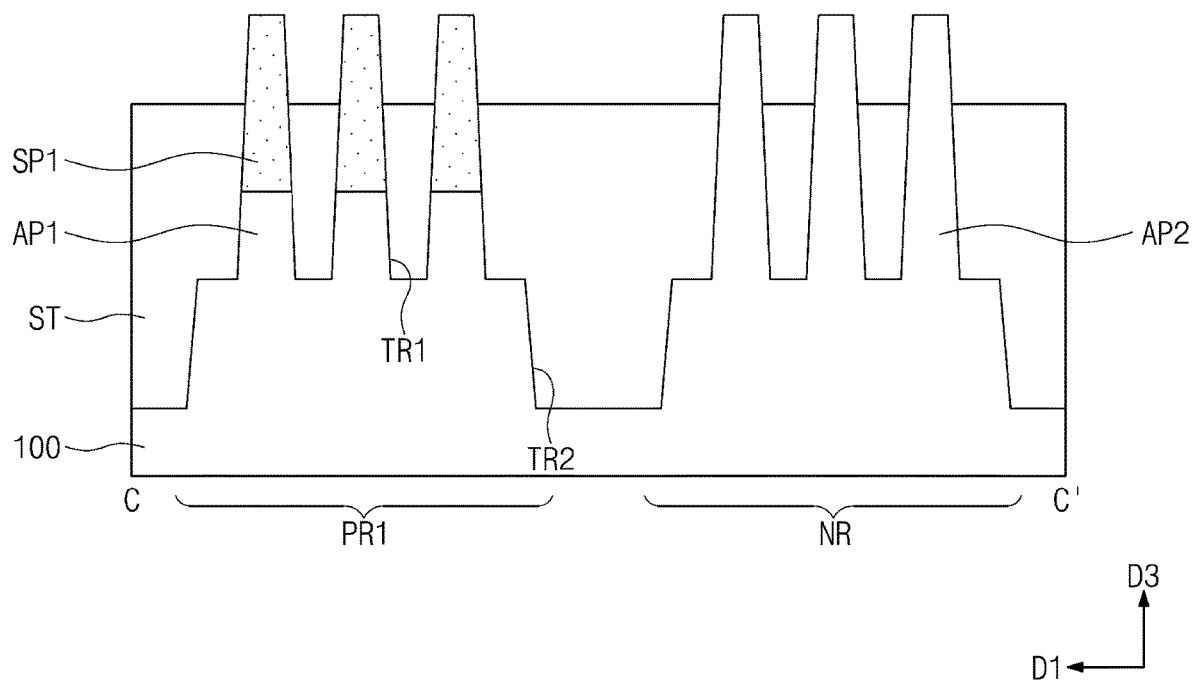

Referring to FIGS. 10, 11A and 11B, the second mask layer ML2 may be removed. The substrate 100 may be patterned to form first and second active patterns AP1 and AP2. The first active patterns AP1 may be formed on the PMOSFET region PR, and the second active patterns AP2 may be formed on the NMOSFET region NR. First trenches TR1 may be formed between the first active patterns AP1 and between the second active patterns AP2.

The formation of the first active patterns AP1 may include patterning the semiconductor layer SL to form first to third semiconductor patterns SP1, SP2 and SP3 on the first to third active regions PR1, PR2 and PR3, respectively. In other words, an upper portion of the first active pattern AP1 of the first active region PR1 may include the first semiconductor pattern SP1. An upper portion of the first active pattern AP1 of the second active region PR2 may include the second semiconductor pattern SP2. An upper portion of the first active pattern AP1 of the third active region PR3 may include the third semiconductor pattern SP3.

The substrate 100 may be patterned to form a second trench TR2 between the PMOSFET region PR and the NMOSFET region NR. The second trench TR2 may be deeper than the first trench TR1.

A device isolation layer ST may be formed on the substrate 100 to fill the first and second trenches TR1 and TR2. The device isolation layer ST may include an insulating material such as a silicon oxide layer. The device isolation layer ST may be recessed until upper portions of the first and second active patterns AP1 and AP2 are exposed. Thus, the upper portions of the first and second active patterns AP1 and AP2 may vertically protrude from the device isolation layer ST. The first to third semiconductor patterns SP1, SP2 and SP3 of the first active pattern AP1 may vertically protrude from the device isolation layer ST.

Figure 12:
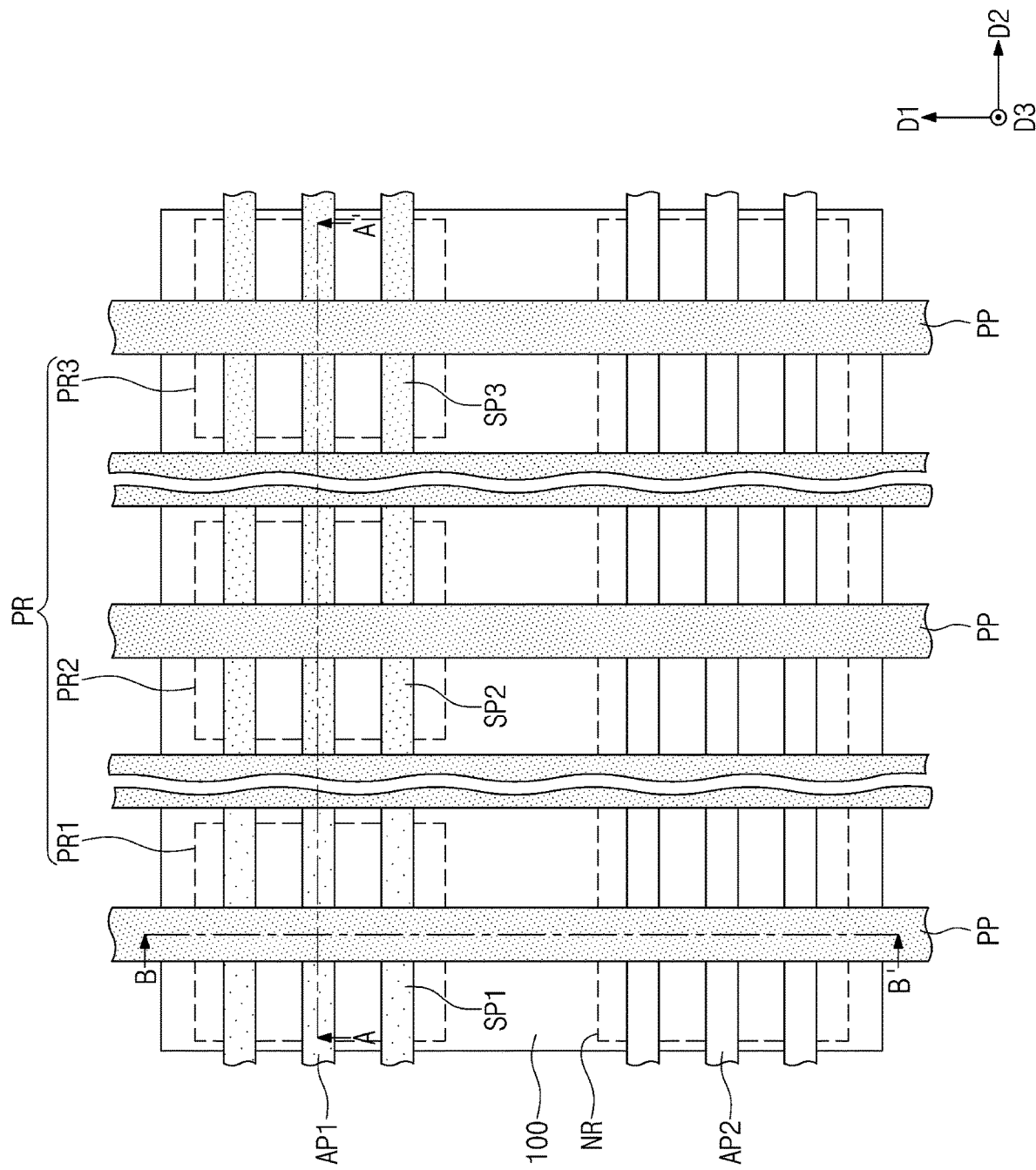
Figure 13A:
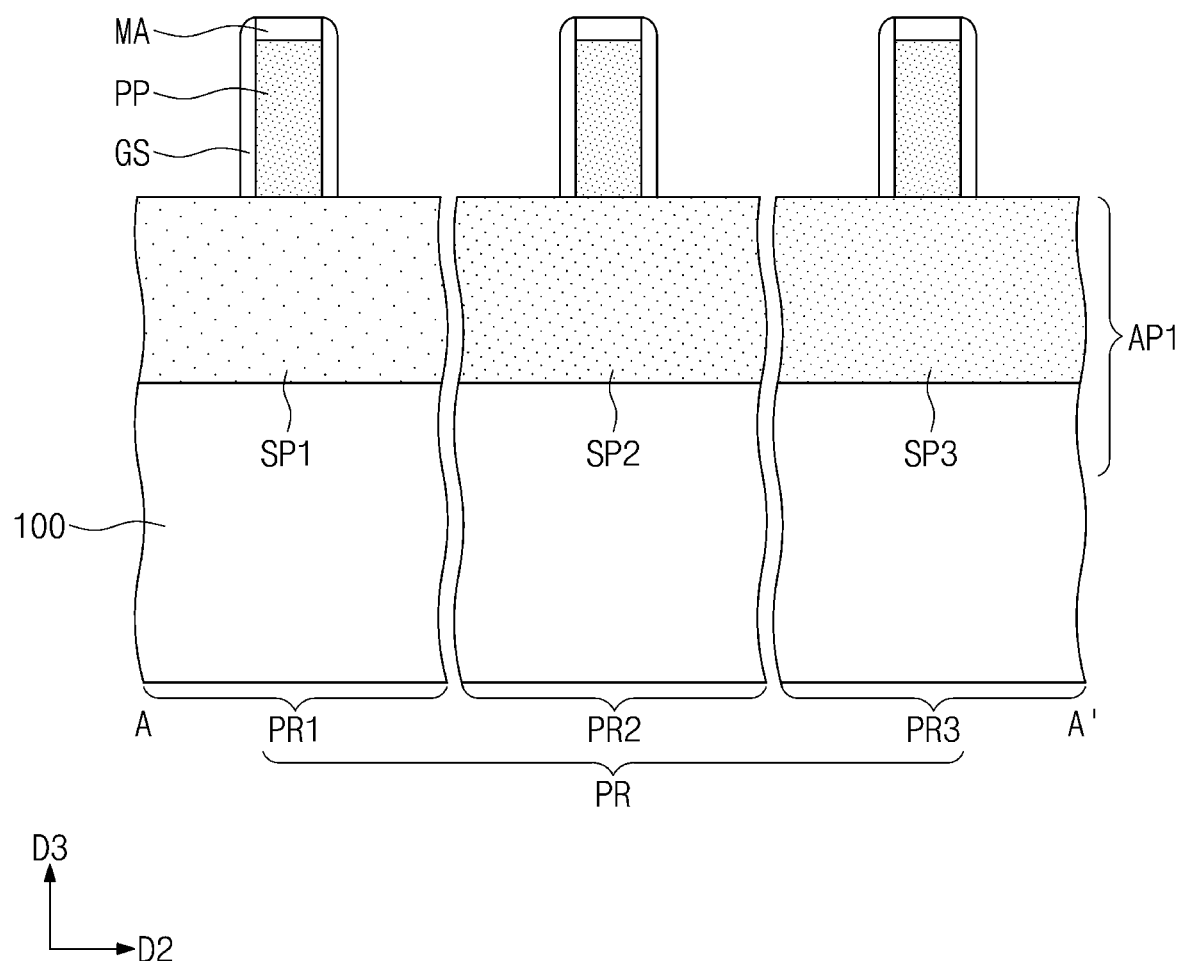
Figure 13B:
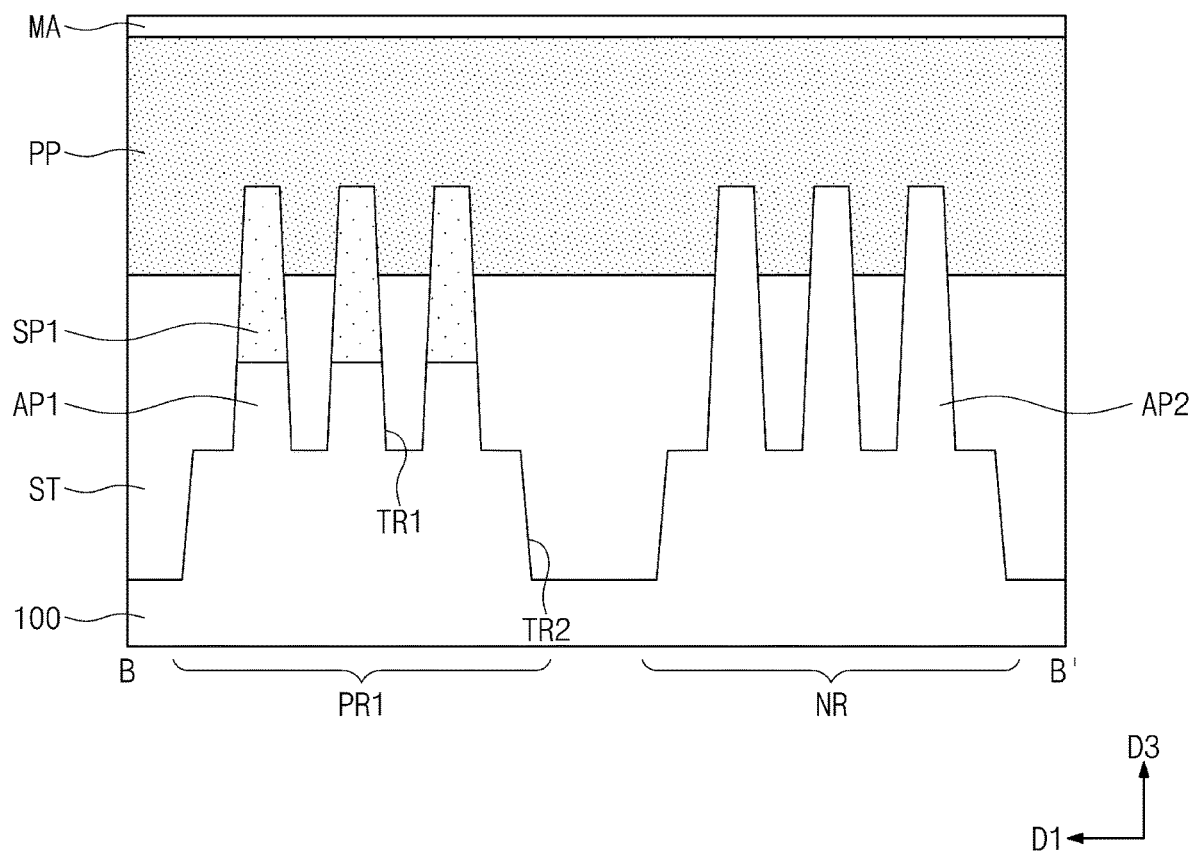
Figure 14:
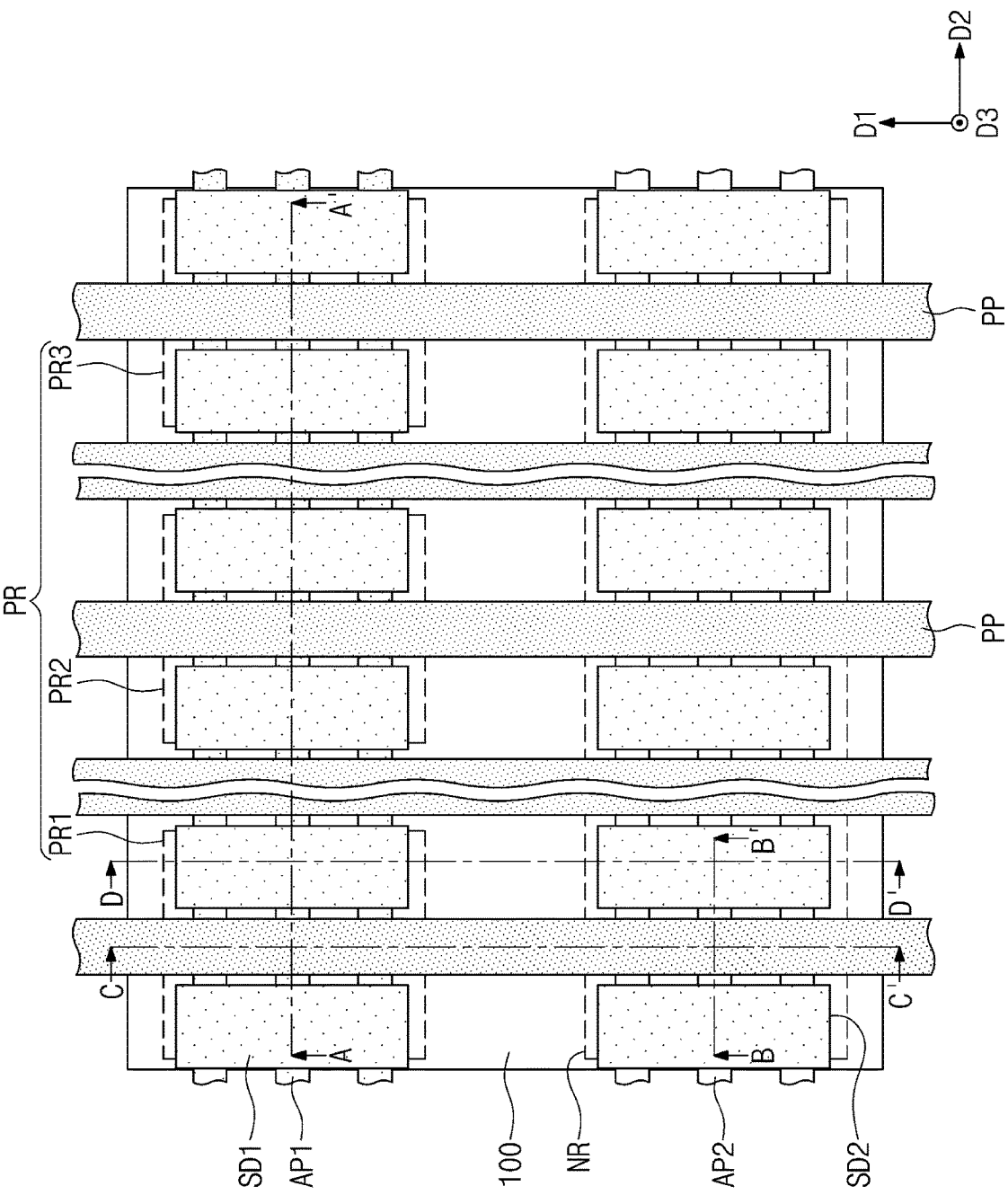

Referring to FIGS. 12, 13A and 13B, sacrificial patterns PP may be formed to intersect the first and second active patterns AP1 and AP2. The sacrificial patterns PP may have line shapes or bar shapes, which extend in the first direction D1. For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include poly-silicon.

A pair of gate spacers GS may be formed on both sidewalls of each of the sacrificial patterns PP, respectively. The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In some embodiments, the gate spacer layer may be formed of a multi-layer including at least two of SiCN, SiCON, or SiN.

Referring to FIGS. 14 and 15A to 15D, first source/drain patterns SD1 may be formed in an upper portion of the first active pattern AP1. A pair of the first source/drain patterns SD1 may be formed at both sides of each of the sacrificial patterns PP.

In detail, the upper portion of the first active pattern AP1 may be etched using the hard mask patterns MA and the gate spacers GS as etch masks to form first recess regions. The device isolation layer ST between the first active patterns AP1 may be recessed while the upper portions of the first active patterns AP1 are etched.

The first source/drain patterns SD1 may be formed by performing a selective epitaxial growth (SEG) process using inner surfaces of the first recess regions of the first active patterns AP1 as a seed layer. Since the first source/drain patterns SD1 are formed, a first channel pattern CH1 may be defined between the pair of first source/drain patterns SD1. For example, the SEG process may include a chemical vapor deposition (CVD) process or a molecular beam epitaxy (MBE) process. The first source/drain patterns SD1 may include a semiconductor element (e.g., SiGe) of which a lattice constant is greater than that of a semiconductor element of the substrate 100. In some embodiments, each of the first source/drain patterns SD1 may be formed of a plurality of stacked semiconductor layers.

In some embodiments, dopants may be injected in-situ into the first source/drain patterns SD1 during the SEG process for forming the first source/drain patterns SD1. In certain embodiments, the dopants may be injected or implanted into the first source/drain patterns SD1 after the SEG process for forming the first source/drain patterns SD1. The first source/drain patterns SD1 may be doped with the dopants to have a first conductivity type (e.g., a P-type).

Second source/drain patterns SD2 may be formed in an upper portion of the second active pattern AP2. A pair of the second source/drain patterns SD2 may be formed at both sides of each of the sacrificial patterns PP.

In detail, the upper portion of the second active pattern AP2 may be etched using the hard mask patterns MA and the gate spacers GS as etch masks to form second recess regions. The second source/drain patterns SD2 may be formed by performing a SEG process using inner surfaces of the second recess regions of the second active pattern AP2 as a seed layer. Since the second source/drain patterns SD2 are formed, a second channel pattern CH2 may be defined between the pair of second source/drain patterns SD2. For example, the second source/drain patterns SD2 may include the same semiconductor element (e.g., silicon) as the substrate 100. The second source/drain patterns SD2 may be doped with dopants to have a second conductivity type (e.g., an N-type).

The first source/drain patterns SD1 and the second source/drain patterns SD2 may be sequentially formed by different processes from each other. In other words, the first source/drain patterns SD1 may not be formed simultaneously with the second source/drain patterns SD2.

Referring to FIGS. 16 and 17A to 17D, a first interlayer insulating layer 110 may be formed to cover, overlap, or extend over the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized until top surfaces of the sacrificial patterns PP are exposed. The planarization process of the first interlayer insulating layer 110 may be performed using an etch-back process or a chemical mechanical polishing (CMP) process. The hard mask patterns MA may be completely removed during the planarization process. As a result, a top surface of the first interlayer insulating layer 110 may be substantially coplanar with the top surfaces of the sacrificial patterns PP and top surfaces of the gate spacers GS.

The sacrificial patterns PP may be replaced with gate electrodes GE, respectively. In more detail, the exposed sacrificial patterns PP may be selectively removed. Empty spaces may be formed by the removal of the sacrificial patterns PP. A gate dielectric pattern GI, a gate electrode GE and a gate capping pattern GP may be formed in each of the empty spaces. The gate electrode GE may include a first metal pattern WF1, a second metal pattern WF2, and an electrode pattern EL.

The first metal pattern WF1 on the second active region PR2 may be formed to be thicker than the first metal pattern WF1 on the first active region PR1. The first metal pattern WF1 on the third active region PR3 may be formed to be thicker than the first metal pattern WF1 on the second active region PR2.

Referring again to FIGS. 1 and 2A to 2D, a second interlayer insulating layer 120 may be formed on the first interlayer insulating layer 110. The second interlayer insulating layer 120 may include a silicon oxide layer. Active contacts AC may be formed in the second and first interlayer insulating layers 120 and 110. The active contacts AC may penetrate the second and first interlayer insulating layers 120 and 110 so as to be electrically connected to the first and second source/drain patterns SD1 and SD2.

A third interlayer insulating layer 130 may be formed on the second interlayer insulating layer 120. A first metal layer may be formed in the third interlayer insulating layer 130. The first metal layer may include first interconnection lines M1, first vias V1, and second vias V2.

Figure 18:
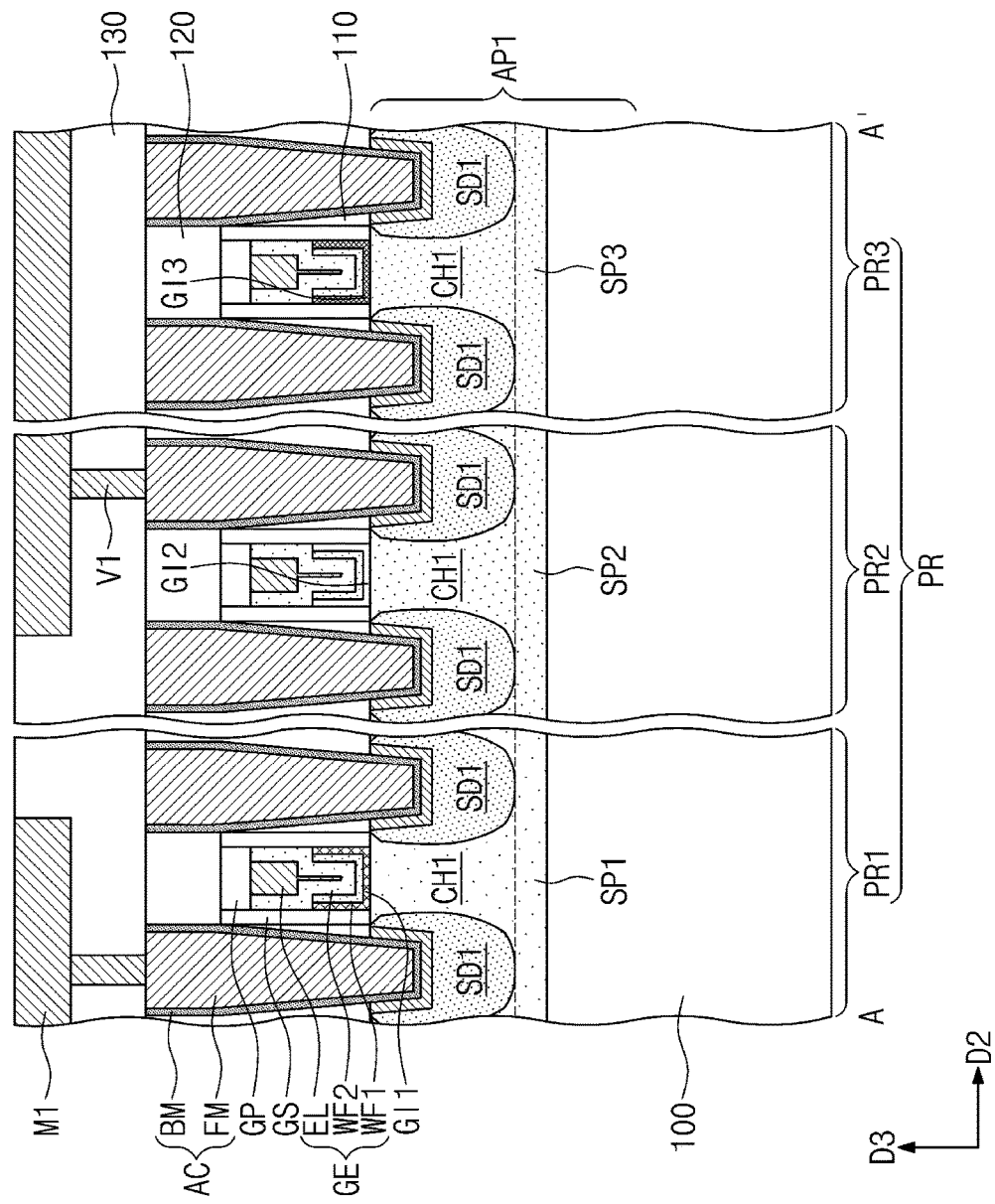
FIGS. 18 and 19 are cross-sectional views taken along the line A-A' of FIG. 1 to illustrate semiconductor devices according to some embodiments of the inventive concepts.
Figure 19:
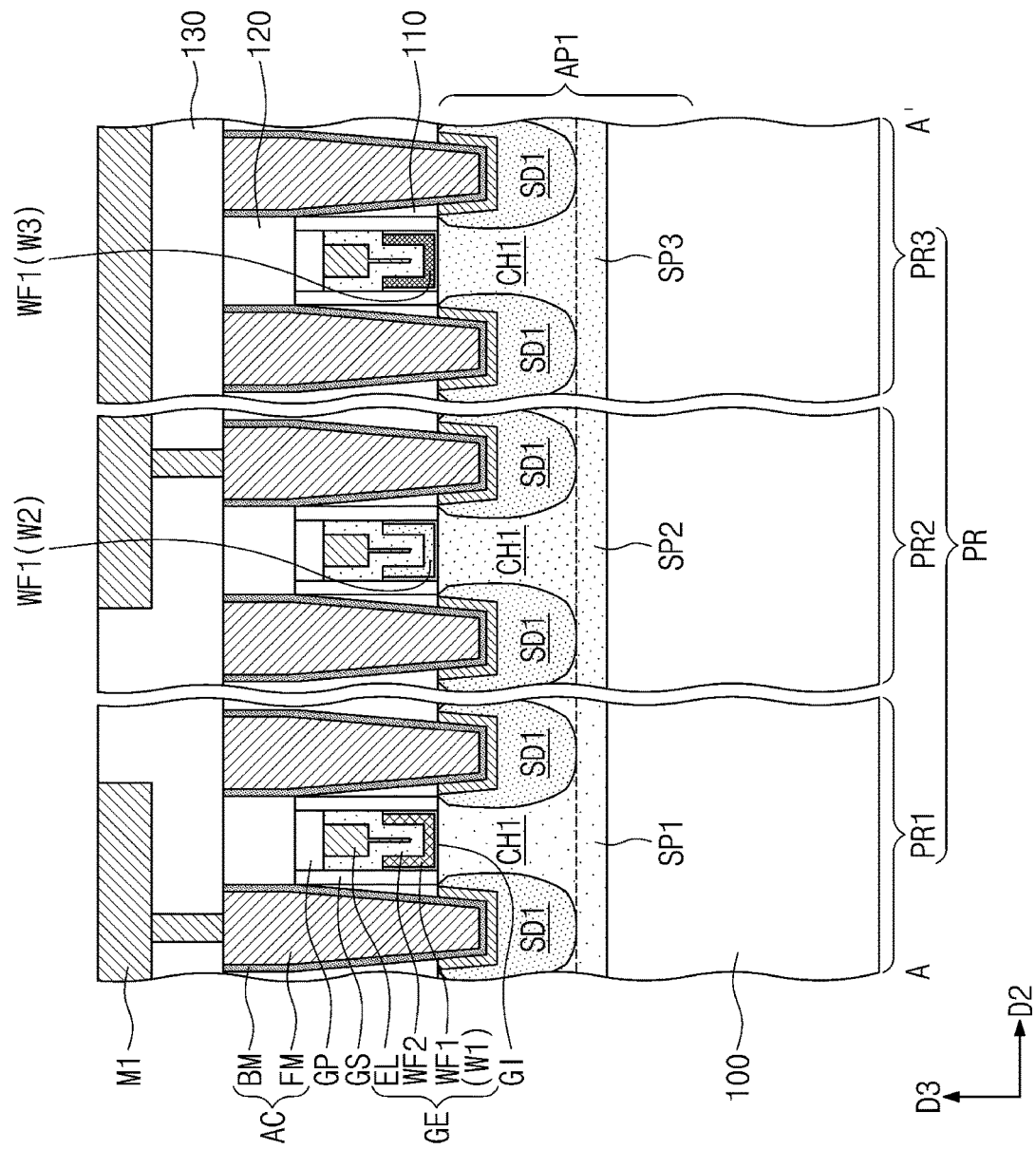

FIGS. 18 and 19 are cross-sectional views taken along the line A-A' of FIG. 1 to illustrate semiconductor devices according to some embodiments of the inventive concepts. In the present embodiments, the descriptions to the same technical features as in the embodiments of FIGS. 1 and 2A to 2D will be omitted for the purpose of ease and convenience in explanation. In other words, differences between the present embodiments and the embodiments of FIGS. 1 and 2A to 2D will be mainly described hereinafter.

Referring to FIG. 18, first to third gate dielectric patterns GI1, GI2 and GI3 may be provided on the first to third active regions PR1, PR2 and PR3, respectively. The first gate dielectric pattern GI1 may be disposed between the gate electrode GE and the first semiconductor pattern SP1. The second gate dielectric pattern GI2 may be disposed between the gate electrode GE and the second semiconductor pattern SP2. The third gate dielectric pattern GI3 may be disposed between the gate electrode GE and the third semiconductor pattern SP3. Thicknesses of first metal patterns WF1 on the first to third active regions PR1, PR2 and PR3 may be equal to each other.

The first gate dielectric pattern GI1 may include a first dipole. The first dipole may include lanthanum (La). For example, the first gate dielectric pattern GI1 may include hafnium oxide containing lanthanum (La). The hafnium oxide containing lanthanum (La) in the first gate dielectric pattern GI1 may reduce an effective work function of the gate electrode GE.

The formation of the first gate dielectric pattern GI1 may include forming a first dipole layer including lanthanum oxide on the first gate dielectric pattern GI1, and performing an annealing process on the first dipole layer to diffuse lanthanum into the first gate dielectric pattern GI1. Thus, a first dipole-interface may be formed in the first gate dielectric pattern GI1.

The third gate dielectric pattern GI3 may include a second dipole. The second dipole may include aluminum (Al). For example, the third gate dielectric pattern GI3 may include hafnium oxide containing aluminum (Al). The hafnium oxide containing aluminum (Al) in the third gate dielectric pattern GI3 may increase an effective work function of the gate electrode GE.

The formation of the third gate dielectric pattern GI3 may include forming a second dipole layer including aluminum oxide on the third gate dielectric pattern GI3, and performing an annealing process on the second dipole layer to diffuse aluminum into the third gate dielectric pattern GI3. Thus, a second dipole-interface may be formed in the third gate dielectric pattern GI3.

The second gate dielectric pattern GI2 may not include a dipole. In other words, the second gate dielectric pattern GI2 may include hafnium oxide. The second gate dielectric pattern GI2 may be substantially the same as the gate dielectric pattern GI described above with reference to FIGS. 1 and 2A to 2D.

The effective work function of the gate electrode GE on the third active region PR3 may be relatively increased by interaction of the third gate dielectric pattern GI3 on the third active region PR3 and the concentration of germanium (Ge) of the third semiconductor pattern SP3. The effective work function of the gate electrode GE on the first active region PR1 may be relatively decreased by interaction of the first gate dielectric pattern GI1 on the first active region PR1 and the concentration of germanium (Ge) of the first semiconductor pattern SP1. As a result, without changing the thicknesses of the first metal patterns WF1, the absolute value of the threshold voltage of the PMOS transistor on the third active region PR3 may be much lower than the absolute value of the threshold voltage of the PMOS transistor on the first active region PR1.

Referring to FIG. 19, thicknesses of first metal patterns WF1 on the first to third active regions PR1, PR2 and PR3 may be equal to each other. However, materials of the first metal patterns WF1 on the first to third active regions PR1, PR2 and PR3 may be different from each other.

In detail, the first metal pattern WF1 on the first active region PR1 may include a first work function metal W1. The first work function metal W1 may be a metal having a relatively low work function. The first work function metal W1 may include titanium-aluminum nitride (TiAlN), titanium-silicon nitride (TiSiN), and/or tantalum nitride (TaN). The first metal pattern WF1 on the second active region PR2 may include a second work function metal W2. The second work function metal W2 may include titanium nitride (TiN). The first metal pattern WF1 on the third active region PR3 may include a third work function metal W3. The third work function metal W3 may be a metal having a relatively high work function. The third work function metal W3 may include titanium oxynitride (TiON), tungsten carbonitride (WCN), or molybdenum nitride (MoN).

The effective work function of the gate electrode GE on the third active region PR3 may be relatively increased by interaction of the third work function metal W3 on the third active region PR3 and the concentration of germanium (Ge) of the third semiconductor pattern SP3. The effective work function of the gate electrode GE on the first active region PR1 may be relatively decreased by interaction of the first work function metal W1 on the first active region PR1 and the concentration of germanium (Ge) of the first semiconductor pattern SP1. As a result, without changing the thicknesses of the first metal patterns WF1, the absolute value of the threshold voltage of the PMOS transistor on the third active region PR3 may be much lower than the absolute value of the threshold voltage of the PMOS transistor on the first active region PR1.

Figure 20A:
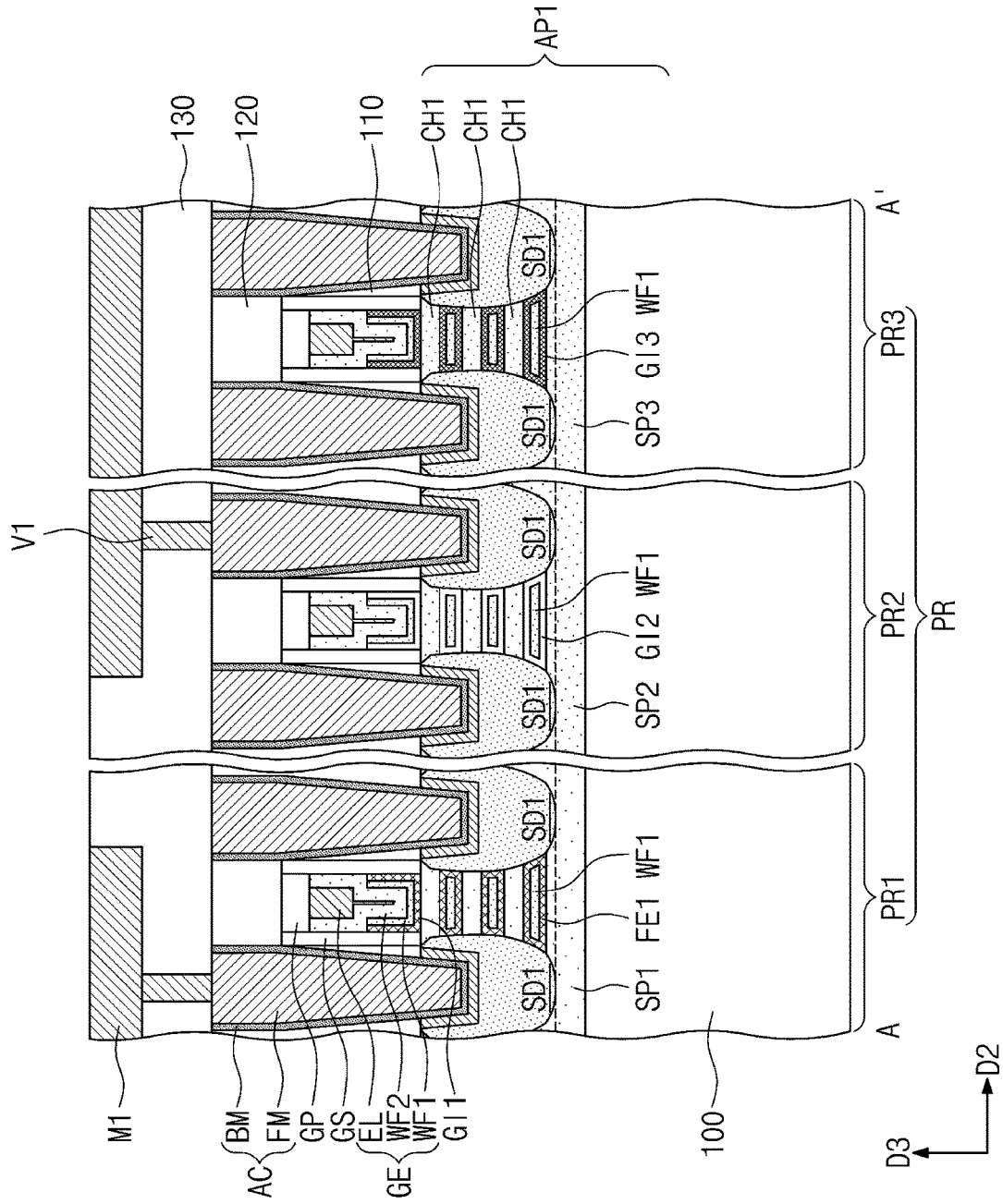
FIGS. 20A, 20B and 20C are cross-sectional views taken along the lines A-A', C-C' and D-D' of FIG. 1, respectively, to illustrate a semiconductor device according to some embodiments of the inventive concepts.
Figure 20B:
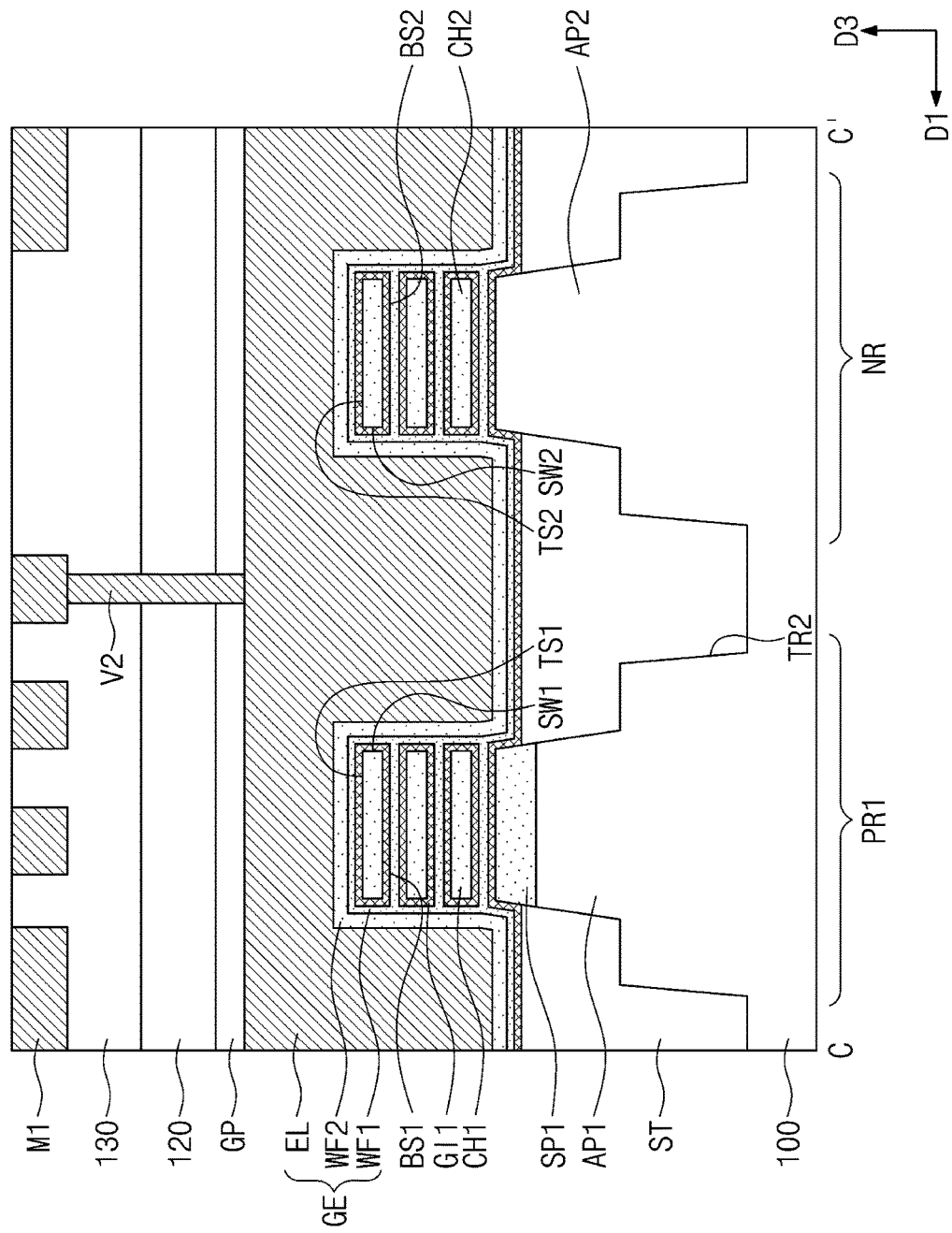
Figure 20C:
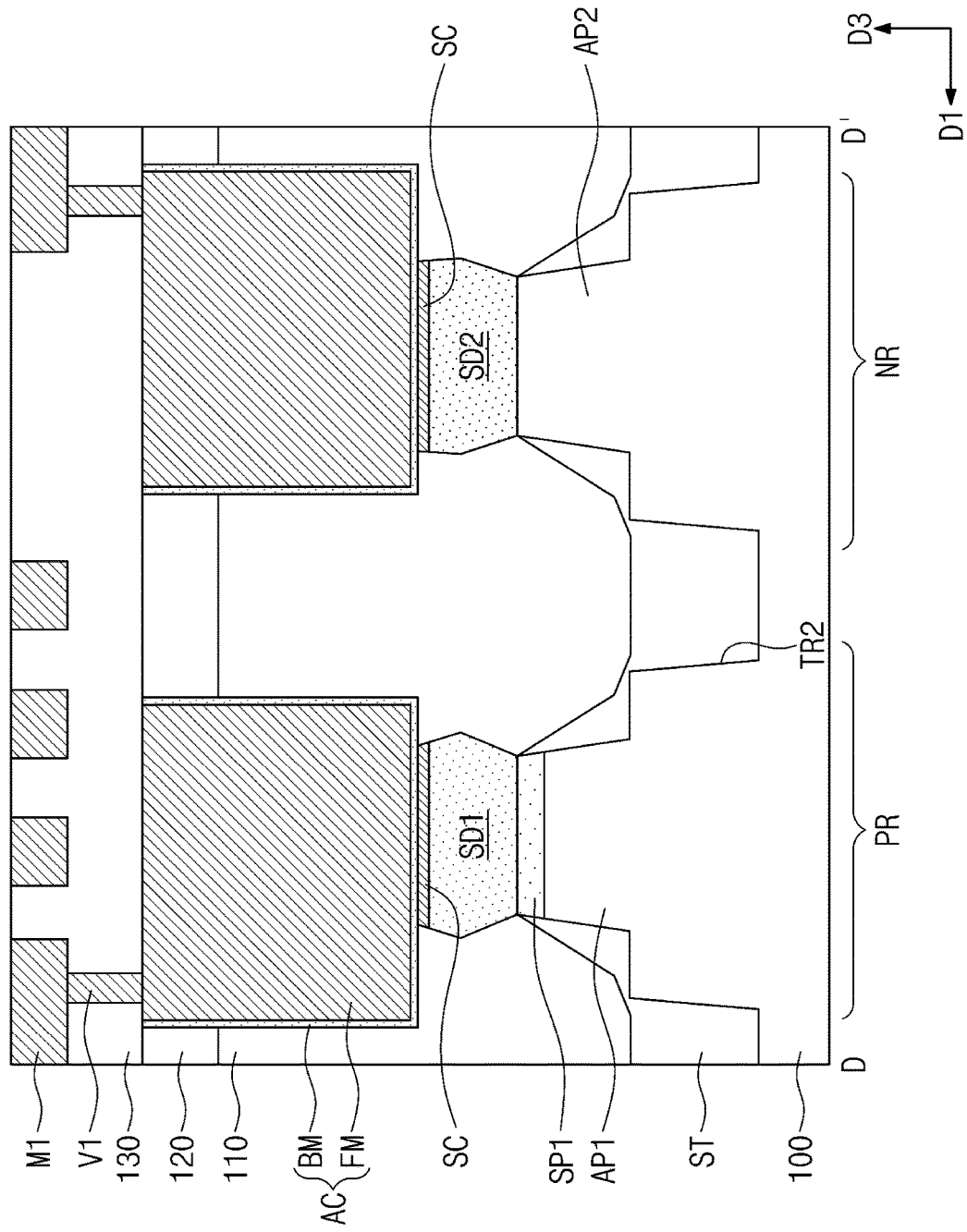

FIGS. 20A, 20B and 20C are cross-sectional views taken along the lines A-A', C-C' and D-D' of FIG. 1, respectively, to illustrate a semiconductor device according to some embodiments of the inventive concepts. In the present embodiment, the descriptions to the same technical features as in the embodiments of FIGS. 1, 2A to 2D and 18 will be omitted for the purpose of ease and convenience in explanation. In other words, differences between the present embodiment and the embodiments of FIGS. 1, 2A to 2D and 18 will be mainly described hereinafter.

Referring to FIGS. 1 and 20A to 20C, a substrate 100 including a PMOSFET region PR and an NMOSFET region NR may be provided. A device isolation layer ST may be provided on the substrate 100. The device isolation layer ST may define a first active pattern AP1 and a second active pattern AP2 on the substrate 100. The first active pattern AP1 and the second active pattern AP2 may be defined on the PMOSFET region PR and the NMOSFET region NR, respectively.

An upper portion of the first active pattern AP1 may include first to third semiconductor patterns SP1, SP2 and SP3. The first to third semiconductor patterns SP1, SP2 and SP3 may be provided on first to third active regions PR1, PR2 and PR3 of the PMOSFET region PR, respectively.

Each of the first to third semiconductor patterns SP1, SP2 and SP3 may include first channel patterns CH1 which are vertically stacked. The stacked first channel patterns CH1 may be spaced apart from each other in a third direction D3. The stacked first channel patterns CH1 may vertically overlap with each other.

The second active pattern AP2 may include second channel patterns CH2 which are vertically stacked. The stacked second channel patterns CH2 may be spaced apart from each other in the third direction D3. The stacked second channel patterns CH2 may vertically overlap with each other. The first and second channel patterns CH1 and CH2 may include at least one of silicon (Si), germanium (Ge), or silicon-germanium (SiGe).

The first active pattern AP1 may further include first source/drain patterns SD1. The stacked first channel patterns CH1 may be disposed between a pair of the first source/drain patterns SD1 adjacent to each other. The stacked first channel patterns CH1 may connect the pair of first source/drain patterns SD1 adjacent to each other.

The second active pattern AP2 may further include second source/drain patterns SD2. The stacked second channel patterns CH2 may be disposed between a pair of the second source/drain patterns SD2 adjacent to each other. The stacked second channel patterns CH2 may connect the pair of second source/drain patterns SD2 adjacent to each other.

Gate electrodes GE may extend in the first direction D1 to intersect the first and second channel patterns CH1 and CH2. The gate electrodes GE may vertically overlap with the first and second channel patterns CH1 and CH2. A pair of gate spacers GS may be disposed on both sidewalls of each of the gate electrodes GE, respectively. A gate capping pattern GP may be provided on each of the gate electrodes GE.

The gate electrode GE may surround each of the first and second channel patterns CH1 and CH2 (see FIG. 20B) in the first direction D1 and/or the third direction D3. The gate electrode GE may be provided on a first top surface TS1, at least one first sidewall SW1 and a first bottom surface BS1 of the first channel pattern CH1. The gate electrode GE may be provided on a second top surface TS2, at least one second sidewall SW2 and a second bottom surface BS2 of the second channel pattern CH2. In other words, the gate electrode GE may surround the top surface, the bottom surface and both sidewalls of each of the first and second channel patterns CH1 and CH2. Transistors according to some embodiment may be 3D field effect transistors (e.g., MBCFETs) in which the gate electrode GE three-dimensionally surrounds the channel patterns CH1 and CH2.

A first gate dielectric pattern GI1 may be provided between the gate electrode GE and the first channel pattern CH1 on the first active region PR1. A second gate dielectric pattern GI2 may be provided between the gate electrode GE and the first channel pattern CH1 on the second active region PR2. A third gate dielectric pattern GI3 may be provided between the gate electrode GE and the first channel pattern CH1 on the third active region PR3. The first to third gate dielectric patterns GI1, GI2 and GI3 may be substantially the same as described above with reference to FIG. 18.

A first interlayer insulating layer 110 and a second interlayer insulating layer 120 may be provided on an entire top surface of the substrate 100. Active contacts AC may penetrate the second and first interlayer insulating layers 120 and 110 so as to be connected to the first and second source/drain patterns SD1 and SD2. A third interlayer insulating layer 130 may be provided on the second interlayer insulating layer 120. A first metal layer may be provided in the third interlayer insulating layer 130. The first metal layer may include first interconnection lines M1, first vias V1, and second vias V2.

In the semiconductor device according to some embodiments of the inventive concepts, the threshold voltage of the transistor may be adjusted using the interaction of the thickness of the first metal pattern including the P-type work function metal and the concentration of germanium (Ge) of the channel. According to some embodiments of the inventive concepts, a sufficient difference value between the threshold voltages of the transistors may be obtained. According to some embodiments of the inventive concepts, the threshold voltage of the transistor may be adjusted by controlling the impurity of the gate dielectric pattern and/or a kind of the metal of the first metal pattern.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a substrate comprising a PMOSFET region of the substrate;
   a first active pattern and a second active pattern on the PMOSFET region;
   a plurality of first channel patterns stacked on the first active pattern;
   a plurality of second channel patterns stacked on the second active pattern;
   a first gate electrode on the plurality of first channel patterns;
   a first gate dielectric pattern between the first gate electrode and each of the plurality of first channel patterns;
   a second gate electrode on the plurality of second channel patterns; and
   a second gate dielectric pattern between the second gate electrode and each of the plurality of second channel patterns,
   wherein the plurality of first channel patterns and the plurality of second channel patterns comprise silicon-germanium (SiGe),
   wherein a first concentration of germanium (Ge) of the plurality of first channel patterns is different from a second concentration of germanium (Ge) of the plurality of second channel patterns,
   wherein the first gate dielectric pattern comprises a first dipole,
   wherein the second gate dielectric pattern comprises a second dipole different from the first dipole, and
   wherein a concentration of nitrogen (N) in the plurality of first channel patterns decreases from an uppermost one of the plurality of first channel patterns toward a lowermost one of the plurality of first channel patterns.

2. The semiconductor device of claim 1, wherein a threshold voltage of a first transistor on the first active pattern is different from a threshold voltage of a second transistor on the second active pattern.

3. The semiconductor device of claim 1,
   wherein the first dipole comprises lanthanum (La), and
   wherein the second dipole comprises aluminum (Al).

4. The semiconductor device of claim 1, wherein the first gate electrode is on a top surface, a bottom surface and opposite sidewalls of each of the plurality of first channel patterns.

5. The semiconductor device of claim 4, wherein the second gate electrode is on a top surface, a bottom surface and opposite sidewalls of each of the plurality of second channel patterns.

6. A semiconductor device comprising:
   a substrate comprising an active region of the substrate;
   an active pattern on the active region;
   a plurality of channel patterns stacked on the active pattern; and
   a gate electrode on the plurality of channel patterns,
   wherein the gate electrode is on a top surface, a bottom surface and opposite sidewalls of each of the plurality of channel patterns,
   wherein the plurality of channel patterns comprise silicon-germanium (SiGe),
   wherein the plurality of channel patterns further comprise nitrogen (N) as an impurity,
   wherein a concentration of germanium (Ge) in the plurality of channel patterns increases from an uppermost one of the plurality of channel patterns toward a lowermost one of the plurality of channel patterns, and
   wherein a concentration of nitrogen (N) in the plurality of channel patterns decreases from the uppermost one of the plurality of channel patterns toward the lowermost one of the plurality of channel patterns.

7. The semiconductor device of claim 6, further comprising:
   a pair of source/drain patterns on the active pattern,
   wherein the plurality of channel patterns are interposed between the pair of source/drain patterns.

8. The semiconductor device of claim 6,
   wherein the gate electrode comprises a first metal pattern, a second metal pattern on the first metal pattern, and an electrode pattern on the second metal pattern, and
   wherein the first metal pattern is in a space between adjacent ones of the plurality of channel patterns.

9. The semiconductor device of claim 8, wherein the first metal pattern comprises titanium nitride (TiN), tantalum nitride (TaN), titanium oxynitride (TiON), titanium-silicon nitride (TiSiN), titanium-aluminum nitride (TiAlN), tungsten carbonitride (WCN), or molybdenum nitride (MoN).

10. The semiconductor device of claim 6, further comprising:
    a gate dielectric pattern between the gate electrode and each of the plurality of channel patterns,
    wherein the gate dielectric pattern comprises a dipole selected from lanthanum (La) or aluminum (Al).

* * * * *